United States Patent
Kobayashi et al.

(10) Patent No.: US 7,917,871 B2
(45) Date of Patent: Mar. 29, 2011

(54) METHOD AND PROGRAM FOR PATTERN DATA GENERATION USING A MODIFICATION GUIDE

(75) Inventors: Sachiko Kobayashi, Ichikawa (JP); Suigen Kyoh, Yokohama (JP); Shimon Maeda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 270 days.

(21) Appl. No.: 12/180,244

(22) Filed: Jul. 25, 2008

(65) Prior Publication Data

US 2009/0037852 A1  Feb. 5, 2009

(30) Foreign Application Priority Data

Jul. 26, 2007 (JP) ................................ 2007-194829

(51) Int. Cl.
*G06F 17/50* (2006.01)
(52) U.S. Cl. .............................. 716/51; 716/101; 438/14
(58) Field of Classification Search .................... 716/51, 716/101; 438/14
See application file for complete search history.

(56) References Cited

U.S. PATENT DOCUMENTS

| 7,194,704 | B2 | 3/2007 | Kotani et al. | |
|---|---|---|---|---|
| 2005/0134866 | A1 | 6/2005 | Kyoh et al. | |
| 2005/0188338 | A1* | 8/2005 | Kroyan et al. | 716/9 |
| 2005/0204322 | A1* | 9/2005 | Kotani et al. | 716/10 |
| 2007/0234243 | A1 | 10/2007 | Kyoh | |
| 2007/0264731 | A1* | 11/2007 | Jeng | 438/14 |
| 2008/0098341 | A1 | 4/2008 | Kobayashi et al. | |
| 2008/0301620 | A1* | 12/2008 | Ye et al. | 716/19 |

FOREIGN PATENT DOCUMENTS

| JP | 2005-181524 | 7/2005 |
|---|---|---|
| JP | 2005-181612 | 7/2005 |

OTHER PUBLICATIONS

Kotani et al.; "Development of Hot Spot Fixer (HSF)"; Design and Process Integration for Microelectronic Manufacturing IV; Proc. SPIE, vol. 6156 (Feb. 23, 2006); San Jose, CA, USA; Online Publication Date: Mar. 24, 2006; pp. 1-8.*
Maeda; "Pattern Producing Method, Semiconductor Device Manufacturing Method and Program", U.S. Appl. No. 11/892,764, filed Aug. 27, 2007.
Kobayashi et al.; "Automated Hot-Spot Fixing System Applied for Metal Layers of 65 NM Logic Devices", Procs. of SPIE, vol. 6283, pp. 62830R-1-62830R-11, (2006).

* cited by examiner

*Primary Examiner* — Naum B Levin
(74) *Attorney, Agent, or Firm* — Finnegan, Henderson, Farabow, Garrett & Dunner, L.L.P.

(57) ABSTRACT

A pattern data generation method of an aspect of the present invention, the method includes creating at least one modification guide to modify a modification target point contained in pattern data, evaluating the modification guides on the basis of an evaluation item, the evaluation item being a change in the shape of the pattern data for the modification target point caused by the modification based on the modification guides or a change in electric characteristics of a pattern formed in accordance with the pattern data, selecting a predetermined modification guide from among the modification guides on the basis of the evaluation result of the modification guides, and modifying the modification target point in accordance with the selected modification guide.

16 Claims, 14 Drawing Sheets

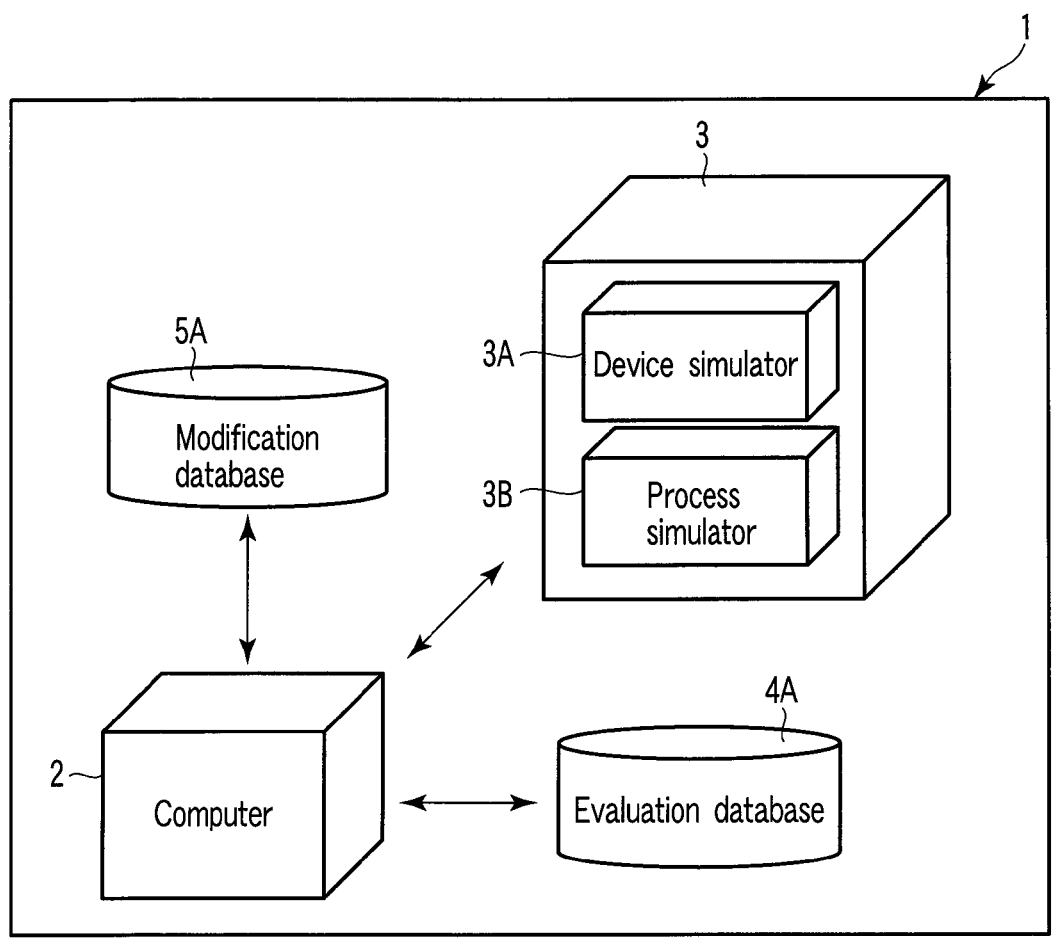
F I G. 2

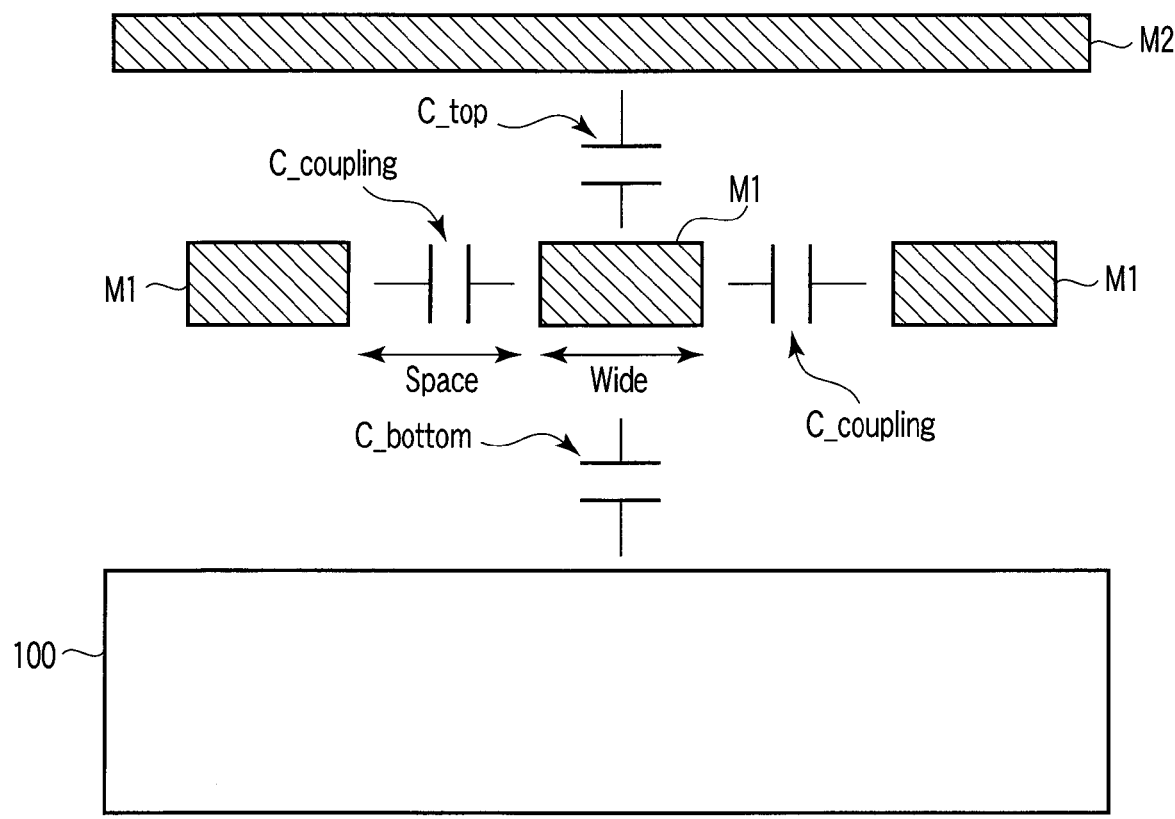
F I G. 5

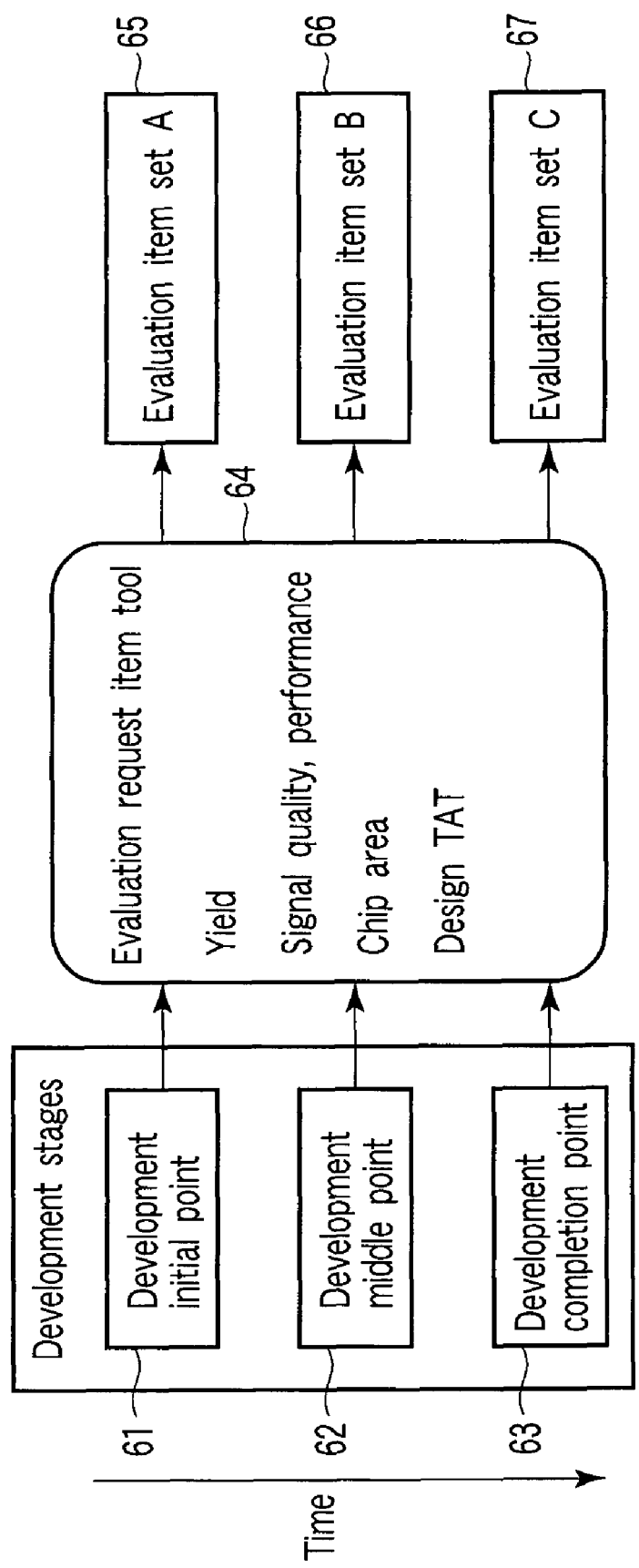
F I G. 12

METHOD AND PROGRAM FOR PATTERN DATA GENERATION USING A MODIFICATION GUIDE

CROSS-REFERENCE TO RELATED APPLICATIONS

This application is based upon and claims the benefit of priority from prior Japanese Patent Application No. 2007-194829, filed Jul. 26, 2007, the entire contents of which are incorporated herein by reference.

BACKGROUND OF THE INVENTION

1. Field of the Invention

The present invention relates to a pattern data generation method, and more particularly, it relates to a method of generating interconnect layer pattern data by an automatic arrangement/interconnection tool. The present invention also relates to a program for causing a computer to generate pattern data.

2. Description of the Related Art

Recently, elements constituting a semiconductor device such as a memory and an integrated circuit have been miniaturized. Accordingly, in the step of transferring a design pattern onto a wafer, an insufficient process margin between adjacent patterns tends to increase process risk points (also referred to as hot spots) where a short circuit or breakage may occur.

The insufficient process margin results in, for example, an error in which a pattern is connected or disconnected at an unexpected point or an error in which a line width or space does not satisfy predetermined conditions.

For these points, at least one of a design rule parameter, a process proximity effect correction parameter and a semiconductor process parameter is repetitively optimized to create a design layout change guideline. There has been disclosed a technique to partly modify a design layout on the basis of the design layout changing guideline (e.g., refer to Jpn. Pat. Appln. KOKAI Publication No. 2005-181524, Jpn. Pat. Appln. KOKAI Publication No. 2005-181612).

For example, Jpn. Pat. Appln. KOKAI Publication No. 2005-181612 has disclosed a technique for modifying edges constituting a pattern to derive a pattern satisfying predetermined conditions. Further, "Automated hotspot fixing system applied for metal layers of 65 nm logic devices" (S. Kobayashi et al., Proc. SPIE Vol. 6283, 62830R1-62830R11) has disclosed a technique for specifying amounts of modifications of a line width and a space width on a design layout to modify a process risk point such that the process risk point may be removed from the design layout.

In connection with these techniques, with regards a processing aspect when a single modification guide or a plurality of modification guides are generated in extracting risk points using a process simulator, it is difficult to determine which guide is the best for use in a modification when all factor such as the design, device characteristics, mask data processing (MDP), optical proximity effect correction (OPC), resolution enhancement techniques (RET), a mask formation process, a wafer machining process, etc., are considered.

When a process risk point is modified in accordance with lithography simulation information alone, electric characteristics of an interconnection are significantly changed, which may deteriorate signal integrity. For example, if a critical path or pattern located in the vicinity thereof is modified to a great extent, electric characteristics of the critical path are changed. In such a case, layout designing and timing verification are redone, leading to a significant deterioration in turnaround time (TAT) of the designing of a semiconductor device.

BRIEF SUMMARY OF THE INVENTION

A pattern data generation method of an aspect of the present invention, the method comprising: creating at least one modification guide to modify a modification target point contained in pattern data; evaluating the modification guides on the basis of an evaluation item, the evaluation item being a change in the shape of the pattern data for the modification target point caused by the modification based on the modification guides or a change in electric characteristics of a pattern formed in accordance with the pattern data; selecting a predetermined modification guide from among the modification guides on the basis of the evaluation result of the modification guides; and modifying the modification target point in accordance with the selected modification guide.

A program for causing a computer to execute a pattern data generation method of an aspect of the present invention, the method comprising: creating at least one modification guide to modify a modification target point contained in pattern data; evaluating the modification guides on the basis of an evaluation item, the evaluation item being a change in the shape of the pattern data for the modification target point caused by the modification based on the modification guides or a change in electric characteristics of a pattern formed in accordance with the pattern data; selecting a predetermined modification guide from among the modification guides on the basis of the evaluation result of the modification guides; and modifying the modification target point in accordance with the selected modification guide.

BRIEF DESCRIPTION OF THE SEVERAL VIEWS OF THE DRAWING

FIG. 2 is a conceptual diagram showing main parts of an automatic arrangement/interconnection device;

FIG. 5 is a schematic diagram showing the sectional structure of a semiconductor device;

FIG. 12 is a diagram for explaining an application of the embodiment of the present invention;

DETAILED DESCRIPTION OF THE INVENTION

1. Embodiment

An embodiment of the present invention relates to a pattern data generation method, and more particularly, it relates to a method of generating line pattern data for a semiconductor device by an automatic arrangement/interconnection tool. The pattern data generation method in the present embodiment is described particularly in connection with a method of generating line pattern data designed to form a metal interconnect layer made of, for example, copper (Cu) and aluminum (Al).

Several embodiments for carrying out the present invention will hereinafter be described with reference to the drawings.

(1) Pattern Generation Method

Figure 1:
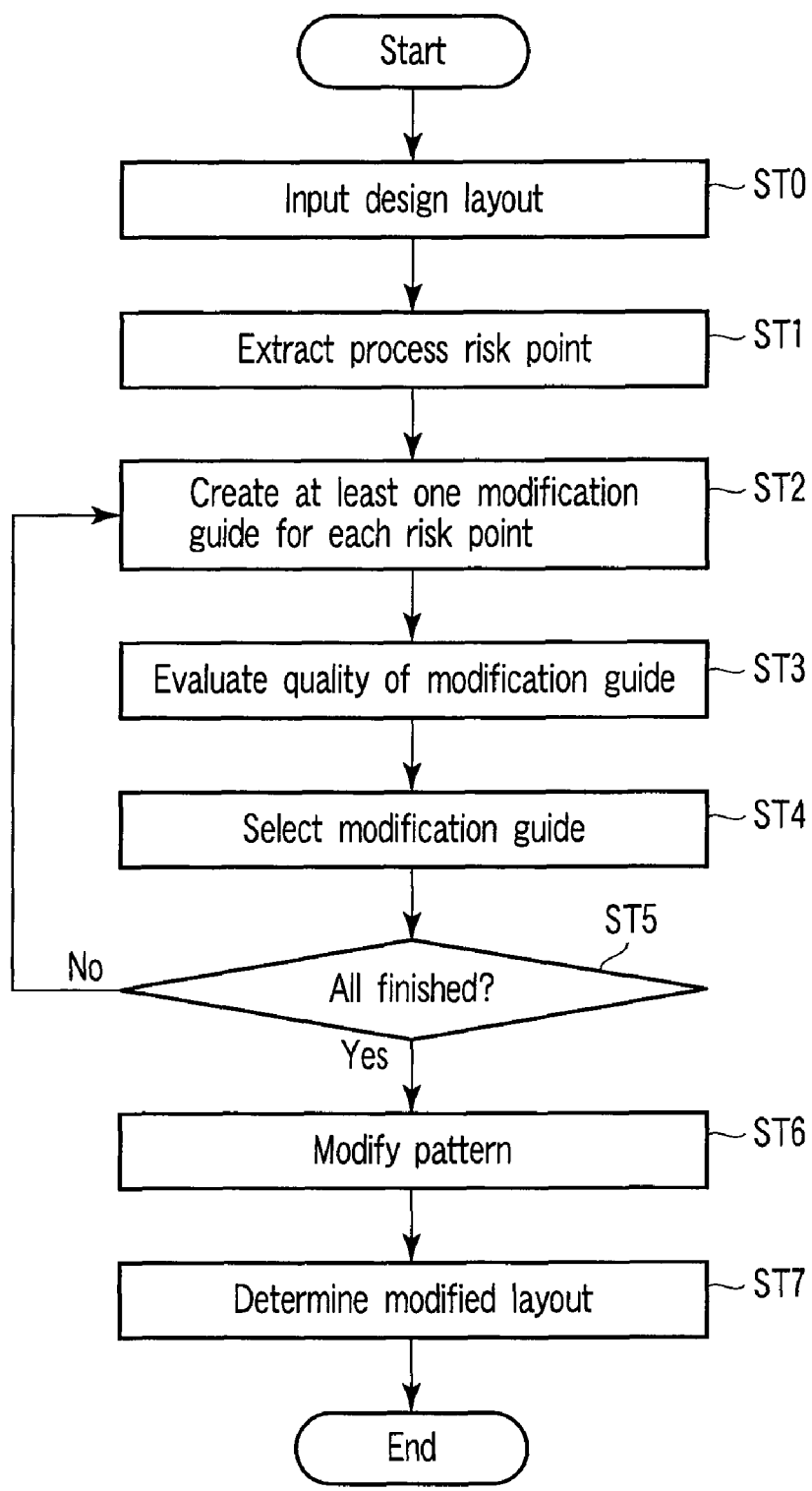
FIG. 1 is a flowchart showing a pattern data generation method in a first embodiment of the present invention.

A pattern data generation method in the embodiment of the present invention is described with FIG. 1 and FIG. 2.

FIG. 1 is a flowchart for explaining the method of generating pattern data for an interconnect layer of a semiconductor device which is an embodiment of the present invention. FIG. 2 is a block diagram showing main parts of a device (e.g., an automatic arrangement/interconnection device 1) for carrying out the embodiment of the present invention.

For example, as shown in FIG. 2, the pattern data generation method shown in FIG. 1 is executed using a computer 2 for input/output of data, a simulator 3 for running a simulation of pattern data, and an evaluation database 4A and a modification guide database 5A which store data. The simulator 3 comprises a device simulator 3A and a process simulator 3B.

On the basis of the result of a simulation performed by the simulator 3 and on the basis of a plurality of evaluation data stored in the evaluation database 4A, the computer 2 selects, for example, a modification guide suitable for OPC processing out of a plurality of modification guides stored in the modification guide database 5A, and then modifies the design pattern data. On the basis of the modified design pattern data, mask pattern data for the interconnect layer of the semiconductor device is generated.

The flow of the pattern data generation method shown in FIG. 1 is described below.

First, design layout data for the interconnect layer of the semiconductor device is input to the computer 2 in the automatic arrangement/interconnection device 1 (ST0). For example, a plurality of line pattern data are arranged along an x direction or y direction in x-y plane coordinates having a grid of 0.2 μm, such that the design layout data is generated. The design layout data input may be data after place-and-route whereby a plurality of cells (elements) and interconnection lines are arranged by the automatic arrangement/interconnection tool. Otherwise, the design layout data input may be the data after the place-and-route which has been subjected to OPC processing or lithography rule check (LRC) processing.

Such design layout data is divided into, for example, a plurality of blocks (hereinafter referred to as layout blocks) and processed. One layout block comprises a plurality of an interconnect layer pattern data. The interconnect layer pattern data further has a plurality of line pattern data representing the shape of an interconnection formed on the basis of the pattern data. Of these pattern data, data is modified for a modification target point where the modification of the line patterns is needed. In the present embodiment, for example, a process risk point is extracted as the modification target point. The process risk point is, for example, pattern data judged to be insufficient in a process margin due to photolithography or etching, or a part of the pattern data.

Then, the computer 2 recognizes a process risk point where a process margin is not secured and, for example, breakage (open) or short circuit (short) may occur, out of the design layout data or layout block data. At this point, for example, the interconnect layer pattern data containing the process risk point is extracted from the design layout data or the layout block data (ST1). In the present embodiment, for example, the interconnect layer pattern data containing the process risk point is extracted as one extraction unit from the design layout data or the layout block data.

The process risk point is extracted in the following manner: whether a line pattern is a process risk point is judged, for example, on the basis of a model base based on a simulation result obtained by the simulator 3, on the basis of a rule base based on, for example, an interconnection pitch and an interconnection width of a line pattern of a semiconductor device to be manufactured, or on the basis of a result which reflects both of the above, and interconnect layer pattern data corresponding to the coordinates of the pattern is extracted.

Then, for the extracted one process risk point in the interconnect layer pattern data, at least one modification guide data is output by, for example, the computer 2 from the modification guide database 5A (ST2). The computer 2 comprises, for example, a modification guide generating tool to read the modification guide data from the modification guide database 5A. In addition, the modification guide data may be sequentially generated by, for example, the simulator 3.

Then, whether the output modification guide is proper is evaluated (ST3). Whether the modification guide is proper is evaluated in consideration of the influence of a change in the shape of the line pattern data on the shape of pattern data adjacent to the pattern data when the line pattern data which has become the process risk point is modified in accordance with the modification guide, or in consideration of a change in the electric characteristics of an interconnection formed on the basis of the modified pattern data or on the basis of pattern data adjacent to the modified pattern data. In other words, in the present embodiment, a plurality of methods of modifying the line pattern data (process risk point) and a plurality of electric characteristics of an interconnection formed by the line pattern data are set as evaluation items for the modification guide, and changes in the shape and electric characteristics due to the modification are converted to numerical values as scores. Then, in accordance with the scores, an evaluation is made as to whether the modification guide, that is, the line pattern data after the modification is good.

The evaluation of the modification guide is carried out by the computer 2 with reference to, for example, results of simulations by the device simulator 3A and the process simulator 3B and the plurality of evaluation data stored in the evaluation database 4A.

On the basis of the result of the evaluation of the modification guide, one modification guide satisfying predetermined conditions and requirements is selected out of the plurality of modification guides (ST4).

The generation and selection of the modification guides by the above-mentioned steps (ST2 to ST4) are repetitively carried out for all the extracted process risk points (ST5). Then, on the basis of the selected modification guide, the pattern data is modified for the input design layout data (ST6).

As a result, design layout data in which the process risk point is modified (hereinafter, a modified layout data) is generated and output (ST7). Then, the OPC processing, the LRC processing and timing verification are carried out for the modified layout data, thereby generating mask pattern data.

As described above, in the pattern data generation method in the embodiment of the present invention, a plurality of modification guides are generated and output for one process risk point, and whether the plurality of generated modification guides are proper is evaluated on the basis of changes in the shape and arrangement of the line pattern of the process risk point or a change in electric characteristics of the line pattern of the process risk point. Then, a highly evaluated modification guide is selected out of the evaluation result, and the pattern data containing the process risk point is modified accordingly.

Thus, according to the embodiment of the present invention, the shape of the line pattern is modified to prevent the breakage or short circuit. Moreover, for each of a plurality of points to be modified in the design layout, consideration is given to the influence, on the adjacent pattern, of the shape of the line pattern data contained in the data to be modified, and to a change, attributed to the data modification, in the electric characteristics of an interconnection formed on the basis of the line pattern data. This assures the reliability of the interconnection formed on the basis of the pattern data, so that the line pattern data can be modified for each of the process risk points.

Furthermore, when the pattern data is modified, the shape of the line pattern is previously modified in consideration of the electric characteristics, such that it is possible to reduce retests of the electric characteristics such as the timing verification after the layout modification, and the layout design of the pattern data can be made more efficient.

Consequently, it is possible to generate interconnect layer pattern data in a short turnaround time (TAT) and provide a design layout produced by highly reliable line pattern data. Further, the reliability of the design layout produced by the line pattern data can be improved, so that the production yield of semiconductor devices can be improved.

(2) Modification Guide Evaluation Method

A modification guide evaluation method in steps ST2 to ST4 in the pattern data generation method in FIG. 1, particularly in the step (ST3) of evaluating the modification guides, is specifically described below.

(2.1) First Evaluation Method

Figure 3:
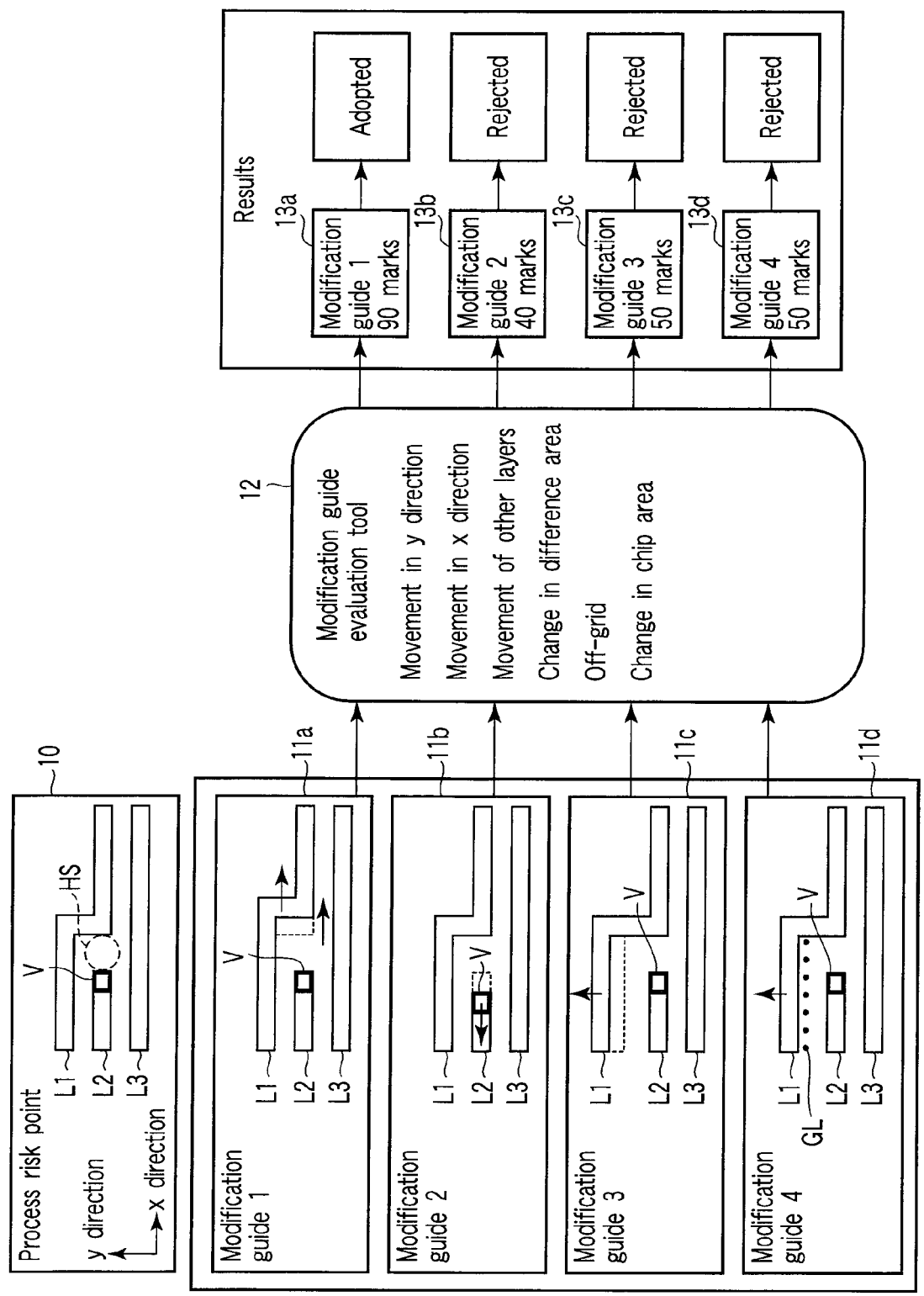
FIG. 3 is a diagram for explaining an evaluation example of modification guides for line pattern data.

The modification guide evaluation method and the evaluation items for making an evaluation are described using FIG. 3 and Table 1.

In a first evaluation method, an example is described wherein when line pattern data containing a process risk point is modified, a modification guide having a small adverse effect on the line pattern data to be modified and pattern data located in the vicinity thereof, that is, a modification guide having small changes in the layout and pattern before and after a modification is selected and adopted from among a plurality of modification guides.

Interconnect layer pattern data 10 in FIG. 3 shows a plan view of an interconnect layer pattern in the design layout data or layout block data.

As shown in FIG. 3, the interconnect layer pattern data 10 containing a process risk point HS is extracted from the design layout by the computer 2. For example, in the interconnect layer pattern data 10, three line pattern data L1 to L3 adjacent in, for example, the y direction are provided.

In the example shown in FIG. 3, the process risk point HS is present between the line pattern L1 and the line pattern L2.

Here, an explanation is made so that the line pattern L1 is the main pattern data targeted for modification.

For the extracted interconnect layer pattern data 10 containing the process risk point HS, at least one modification guide data 11a to 11d is read by the computer 2 from among, for example, the plurality of modification guide data stored in the modification guide database 5A, and a modification guide is generated. In addition, the modification guide data may be sequentially generated by the simulator 3 every time a process risk point HS is extracted.

In general, a great change of a layout causes a greater influence on other line patterns located in the vicinity of a modified line pattern and a greater influence on the electric characteristics of an interconnection formed on the basis of the line pattern data.

On the basis of such influences, numerical values are allocated to each modification method with regard to the movement of the line pattern data targeted for modification in the x or y direction, the movement of other line pattern data, a difference area showing an area change before and after the modification of the line pattern data targeted for modification, and increase in the area of a block and the area of a design layout due to the movement of the line pattern data, whether the line pattern data targeted for modification is arranged on a grid (on-grid or off-grid), such that the modification method is converted to a numerical values. A penalty scoring rule based on the modification method of conversion to a numerical value is created by the computer 2 and a modification guide evaluation tool 12. The scoring rule is stored in, for example, the evaluation database 4A. However, the penalty scoring rule is not uniquely set, and different penalty scoring rules may be created to meet the demands of the shape and kind of the line pattern data targeted for modification and the design layout of a semiconductor device to be manufactured.

Table 1 shows one example of the penalty scoring rule set for the evaluation items for evaluating a modification guide.

TABLE 1

| Evaluation items | Penalty |
| --- | --- |
| Move in y direction | High |
| Move in x direction | Low |
| Change of difference area | Medium |
| Movement of other interconnect patterns | High |
| Off-grid | High |
| Increase of chip area | High |

In the example shown in Table 1, for example, a high penalty is imposed on a modification that causes the line pattern data L1 in FIG. 3 to move in the y direction because this decreases an interconnection pitch between the line pattern data L1 and a line pattern data adjacent thereto in the y direction and can increase an RC delay increase. On the other hand, a low penalty is set to a modification that causes the line pattern data targeted for modification to move in the x direction because the influence on other line pattern data is small. Moreover, in the case of a modification that causes the movement of pattern data such as the line pattern data L2 shown in FIG. 3 to which a via V is connected, the layout of line pattern data provided in a layer higher than the interconnect layer in which the moved line pattern data is provided is also modified. Therefore, this modification has a great influence on the change of the layout, so that a high penalty is set. Likewise, a penalty for the increase of the difference area, a penalty for the increase of a block area, and a penalty for the off-grid are set as shown in Table 1 in accordance with the influence of the modification of the line pattern data. In addition, the scoring rule may include, as a supplementary rule (penalty), a scoring rule whereby a penalty is also set for, for example, the amount of the movement of the line pattern data before and after the modification and a heavier penalty is imposed on a greater amount of the movement of the pattern.

In the modification guide data, at least one kind of modification processing performed on the plurality of modification guide data 11a to 11d as shown in FIG. 3 is scored by the computer 2 and the modification guide evaluation tool 12 on the basis of the penalty scoring rule as shown in Table 1. In accordance with the result of this scoring, the modification guide data 11a to 11d are evaluated. In addition, the modification guide evaluation tool 12 is provided by, for example, a storage unit (not shown) provided inside or outside the computer or a communication line such as an intranet or the Internet.

In the example shown in FIG. 3, the modification guide data 11a indicates a modification guide that causes a part of the line pattern data L1 to be moved in the x direction. The modification guide data 11b indicates a modification guide that causes the movement of the line pattern data L2 which is pattern data different from the line pattern data L1 and which contains the via pattern V and the movement of the upper (lower) line pattern data (not shown). The modification guide data 11c indicates a modification guide that causes the line pattern data L1 to be moved in the y direction. The modification guide data 11d indicates a modification guide that causes the arrangement of the line pattern L1 to be located off an interconnect grid GL (off-grid).

Then, scoring results 13a to 13d generated by the modification guide evaluation tool 12 are output to, for example, the computer 2. In the first evaluation method, a low penalty is imposed on a modification causing the line pattern targeted for modification to be moved in the x direction, in the example shown in Table 1. Therefore, the modification guide data 11a is adopted here from among the plurality of modification guide data, and the other modification guide data 11b to 11d are not adopted. In addition, when there are a plurality of modification guides on the same level of evaluation results, one of them is adopted in accordance with the characteristics required for a semiconductor device to be manufactured.

Then, the modification guide data 11a adopted as a modification guide capable of forming and providing highly reliable interconnection is selected, and acquired by the computer 2. Thus, the process risk point HS contained in the pattern data is modified.

In the present evaluation method, a high evaluation score of the modification guide data means that a change in the shape of a pattern and a change in the electric characteristics of an interconnection formed on the basis of the pattern data have small adverse effects on the line pattern data targeted for modification and line pattern data adjacent thereto. Therefore, the adoption of the modification guide data with a high evaluation score makes it possible to provide highly reliable line pattern data and modification layout data containing such line pattern data.

In addition, although one modification is made in one line pattern data in each of the modification guide data 11a to 11d for the simplification of explanation in the example shown in the present embodiment, it should be understood that a modification guide which makes a plurality of modifications in one or a plurality of line pattern data in one interconnect layer pattern data 10 is also acceptable.

As described above, in the first evaluation method, the scoring rule is set for the modification of the shape or arrangement of the line pattern data targeted for modification in consideration of the influence on other line patterns and the influence on an actual interconnection formed on the basis of the modified data. The modification guides for the line pattern data are evaluated by this scoring rule. Then, a highly evaluated modification guide is adopted and selected from the evaluation results of a plurality of modification guides. Thus, the process risk point HS which is the modification target point is modified.

Hence, according to the first evaluation method, a modification can be made for each of the process risk points HS considering the adverse effect of the shape of the line pattern data to be modified on the adjacent pattern data and considering a change in the electric characteristics of an actual interconnection formed on the basis of the modified line pattern data.

Furthermore, when the shape and arrangement of the line pattern data are modified, the line pattern data is previously modified in consideration of the electric characteristics of an interconnection formed on the basis of the pattern data, such that it is possible to reduce retests of the electric characteristics such as the timing verification after the layout modification, and the layout design of the line pattern can be made more efficient.

Consequently, according to the pattern data generation method of the present embodiment, the use of the first evaluation method makes it possible to provide a design layout produced by highly reliable line pattern data in a short turn-around time (TAT). Further, the reliability of the design layout produced by the line pattern data can be improved, so that the production yield of semiconductor devices can be improved.

(2.2) Second Evaluation Method

In a second evaluation method, an example is described wherein modification guides are evaluated on the basis of the electric characteristics of an actual interconnection formed by pattern data, and from among the plurality of modification guides, a modification guide is adopted which causes a small change in the characteristics of the interconnection (hereinafter referred to as an interconnection quality) such as an RC delay and signal integrity before and after a modification. It is to be noted that the same signs are assigned to the same members as those described above and such members are not described in detail.

Figure 4:
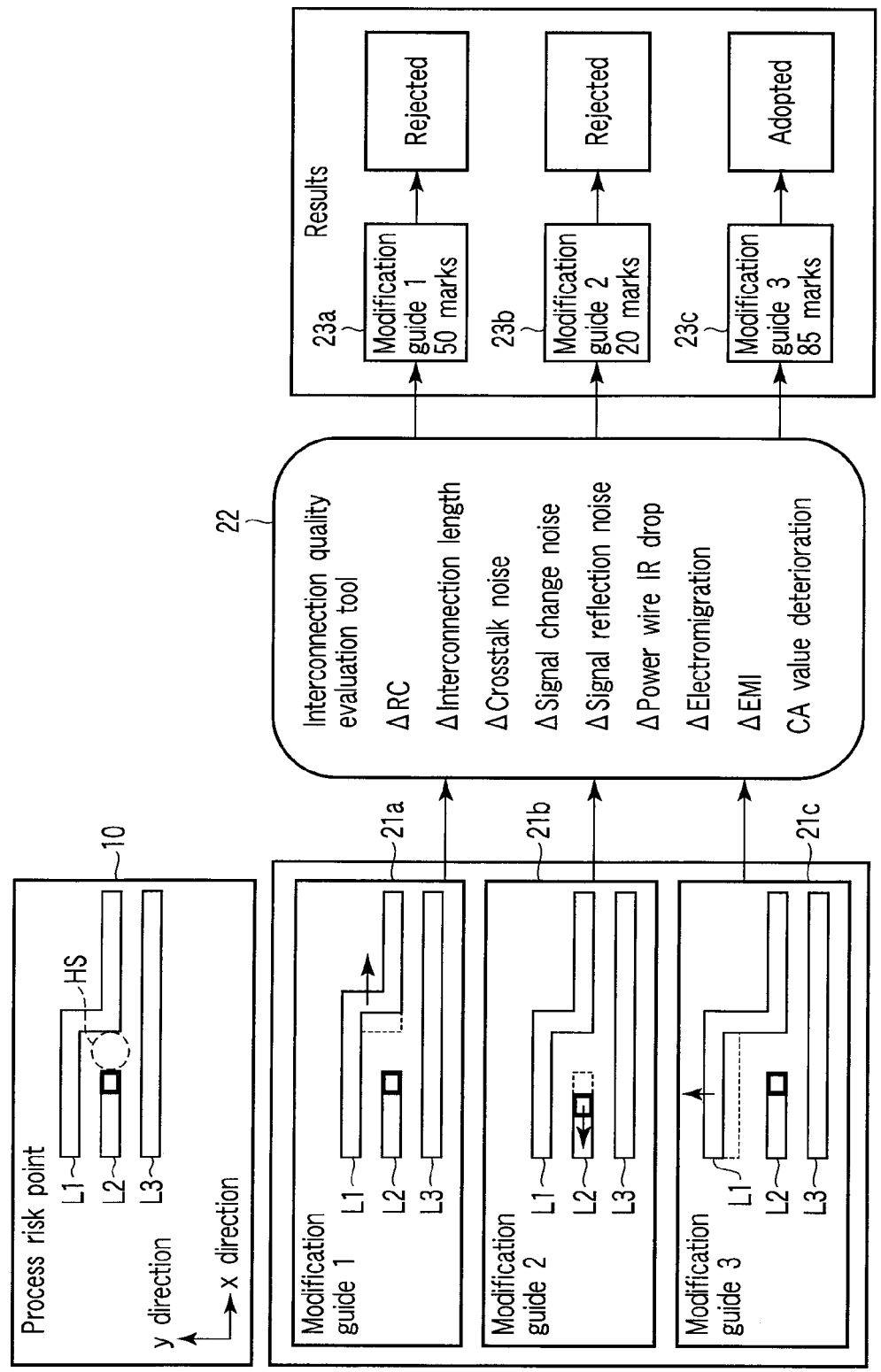
FIG. 4 is a diagram for explaining an evaluation example of modification guides for line pattern data in the embodiment of the present invention.

As shown in FIG. 4, interconnect layer pattern data 10 containing a process risk point HS is extracted by the computer 2 from the design layout, as in the first evaluation method. At least one modification guide data 21a to 21c corresponding to the extracted interconnect layer pattern data 10 is read from the modification guide database 5A.

In addition, in the example shown in FIG. 4, the modification guide data 21a indicates a modification guide that causes a part of the line pattern data L1 to be moved in the x direction. The modification guide data 21b indicates a modification guide that causes the line pattern data L2 containing the via pattern to be moved. The modification guide data 21c indicates a modification guide that causes the line pattern data L1 to be moved in the y direction.

The evaluation of the interconnection quality in the second evaluation method is performed using, as evaluation items, at least one of the following characteristic changes before and after a modification: a change in RC delay ($\Delta$RC), a change in interconnection length ($\Delta$L), a change in crosstalk noise ($\Delta$ crosstalk noise), a change in signal change noise ($\Delta$ signal change), a change in signal reflection noise ($\Delta$ signal reflection noise), a change in power wire IR drop ($\Delta$ power wire IR drop), a change in electromigration (EM) ($\Delta$EM), a change in electromagnetic interference (EMI) ($\Delta$EMI), a change in the number of critical areas (CA) which can be electrically defective due to the presence of particles (hereinafter referred to as a CA value) (ΔCA). Then, scoring rules are created for the respective characteristic variations. For example, the score is lowered for a modification which reduces the pitch between adjacent line pattern because it causes the characteristics changes such as ΔRC and ΔEMI attributed to mutual interference of adjacent interconnection lines. The score is also lowered for a modification which reduces the width of line pattern because it increases the density of a current running in the interconnection formed on the basis of this line pattern data and therefore changes the EM characteristics. The score is lowered for a modification which increases the interconnection length because it changes the resistance value of an interconnection to be formed and therefore changes characteristics such as the Δ power wire IR drop, Δ crosstalk noise and Δ signal change.

For the variations of such electric characteristics, scoring rules are set in accordance with the variations derived from the results of characteristic changes obtained by, for example, experiment or simulations. The scoring rules are set so that, for example, those with smaller variations gain high scores, that is, high quality.

For example, when a scoring rule is set by an experimental result, scores allocated to, for example, characteristic variations are stored in the evaluation database 4A as table data. Moreover, for example, every time modification guide data is generated, a characteristic variation of interconnection formed on the basis of line pattern data may be calculated using the device simulator 3A, and scores may be allocated in accordance with the variations and output to the computer 2. Otherwise, scores may be set by use of the simulator 3 (e.g., the process simulator 3B) as follows: the size of the line pattern targeted for modification is defined as a judgment standard, and a variation of electric characteristics is found by conversion from the difference between the judgment standard pattern size and the size of the modified pattern. When the modification guide data is evaluated using the table data, the turnaround time for the creation of pattern data can be improved. Moreover, when the modification guide is evaluated using the simulator 3, it is possible to be flexible with changes of the line patterns contained in the modification guide data and achieve the calculation and evaluation of the variations with high accuracy.

On the basis of the scoring rules as described above, the generated modification guide data 21a to 21c are evaluated by an interconnection quality evaluation tool 22.

Then, scoring results 23a to 23c generated by the interconnection quality evaluation tool 22 are output to, for example, the computer 2. In addition, the interconnection quality evaluation tool 22 is provided by, for example, a storage unit (not shown) provided inside or outside the computer or a communication line such as the Internet.

In the second evaluation method, higher scores are set to those with small variations of interconnection quality (electric characteristics). Thus, the modification guide data with a high score is selected by the computer 2 as one that is capable of providing a high-quality line pattern.

Here, the modification guide data 21c with the highest score among three modification guide data is adopted, and the process risk point HS is modified by the computer 2.

As described above, in the second evaluation method, a plurality of modification guide data are evaluated on the basis of the electric characteristics of an interconnection formed by pattern data, and one of the modification guides which has a small change in the electric characteristics is selected and adopted.

Hence, according to the present evaluation method, a modification can be made for each of the process risk points considering the influence of a change in the shape of the line pattern data contained in the pattern data to be modified on the adjacent pattern data and considering a change in the electric characteristics of an actual interconnection due to the modification.

In particular, according to the present evaluation method, when the line pattern data is modified, the pattern data is previously modified in consideration of the electric characteristics, such that it is possible to reduce retests of the electric characteristics such as the timing verification after the layout modification, and the layout design of the line pattern can be made more efficient.

Consequently, according to the pattern data generation method of the embodiment of the present invention, the use of the second evaluation method makes it possible to provide a design layout produced by highly reliable line pattern data in a short design TAT. Further, the reliability of the design layout produced by the line pattern data can be improved, so that the production yield of semiconductor devices can be improved.

(2.3) Third Evaluation Method

In a semiconductor device, a plurality of interconnection lines are adjacently provided in the same interconnect layer, and as shown in, for example, FIG. 5, a multilayer interconnection technique is used whereby a plurality of interconnect layers containing a plurality of interconnection lines are stacked.

Since the interconnection is covered with an interlayer insulating film, parasitic capacitance, which is also called interconnection capacitance is generated between interconnection lines adjacent in the same interconnect layer or between interconnection lines vertically adjacent in different interconnect layers.

This interconnection capacitance is one factor of the RC delay, and inhibits the securing of a synchronous clock of the semiconductor device and the high-velocity operation of the semiconductor device.

In a third evaluation method, an example is described wherein modification guides are evaluated on the basis of the interconnection capacitance, and from among the plurality of modification guides, a modification guide is adopted which shows a small change in the interconnection capacitance before and after a modification. The third evaluation method is described below with FIG. 5, FIG. 6 and Table 2. It is to be noted that the same signs are assigned to the same members as those described above and such members are not described in detail. Here, in the interconnection shown in FIG. 5, the interconnection capacitance between adjacent two interconnection lines M1 is called C_coupling. The interconnection capacitance between a certain interconnection M1 and a semiconductor substrate (active region) 100 is called C_bottom. Moreover, the interconnection capacitance between a certain interconnection M1 and an interconnect layer M2 in a layer higher than this interconnection M1 is called C_top.

Figure 6:
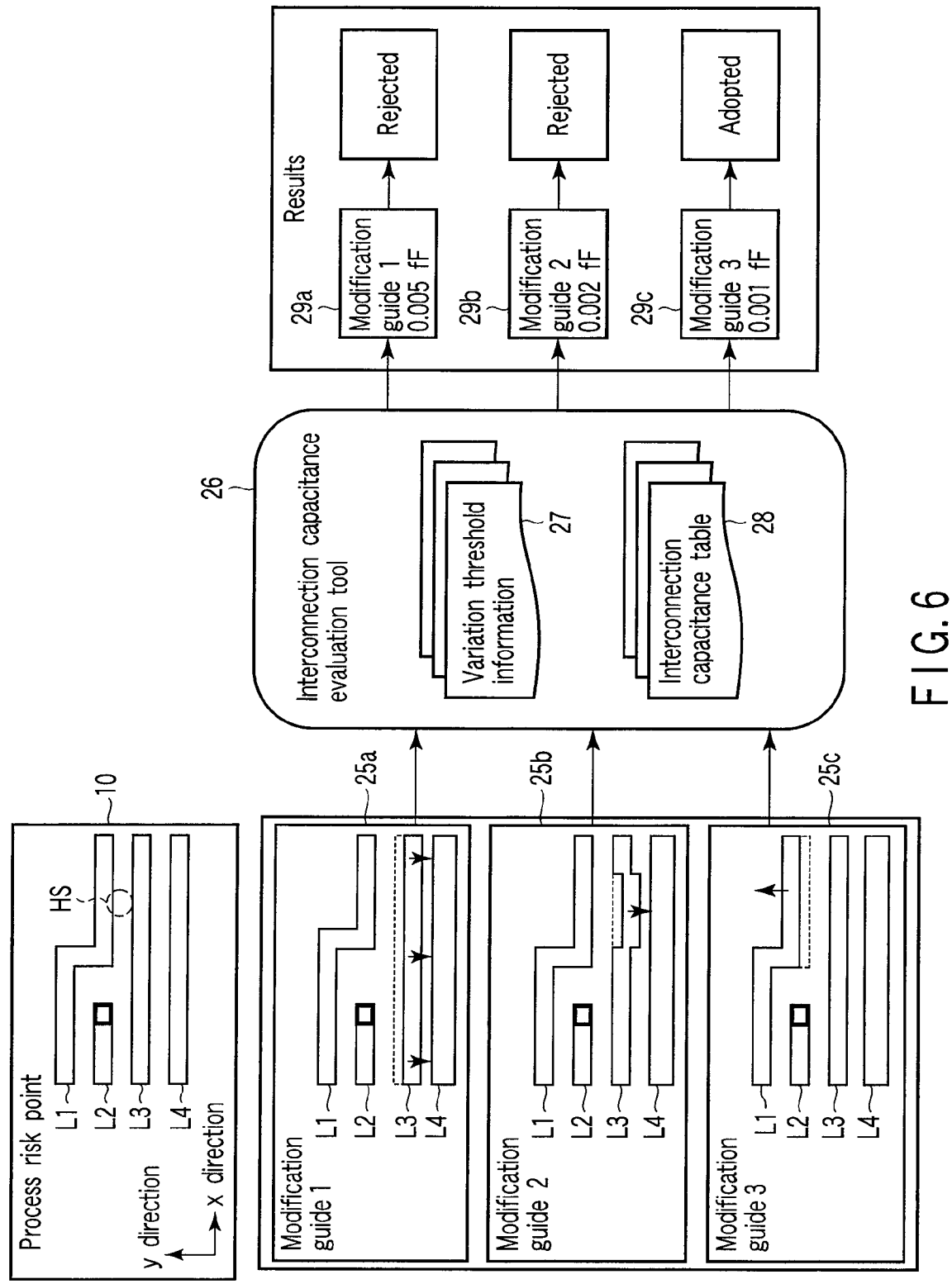
FIG. 6 is a diagram for explaining an evaluation example of modification guides for line pattern data.

As shown in FIG. 6, an interconnect layer pattern data 10 containing a process risk point HS is extracted by the computer 2 from the design layout, as in the first and second evaluation methods. At least one modification guide data 25a to 25c corresponding to the extracted interconnect layer pattern data 10 is read from the modification guide database 5A.

In the example shown in FIG. 6, the modification guide data 25a indicates a modification guide that causes the whole line pattern data L3 to be moved toward line pattern data L4 along the y direction. The modification guide data 25b indicates a modification guide that causes a part of the line pattern data L3 to be moved toward the line pattern data L4 in the y direction. Moreover, the modification guide data 25c indicates a modification guide that causes a part of the line pattern data L1 to be moved toward a side opposite to the side of the line pattern data L3 in the y direction. In addition, in the modification guide data 25c, the part of the line pattern data L1 which has been moved in the y direction by the above-mentioned modification is data which is not arranged on the same grid as the line pattern data L2.

The evaluation of the interconnection quality in the present evaluation method is performed on the basis of the above-mentioned interconnection capacitances C_coupling, C_top and C_bottom.

The interconnection capacitance C_coupling is generated between a line pattern targeted for modification and a line pattern adjacent thereto. The interconnection capacitance C_coupling varies by the increase or decrease of a space between the line pattern targeted for modification and the line pattern adjacent thereto. The interconnection capacitance C_top is generated between a line pattern targeted for modification and a line pattern provided in a layer higher than this line pattern. The interconnection capacitance C_top mainly varies by the increase or decrease of the width of the line pattern targeted for modification. The interconnection capacitance C_bottom is generated between a line pattern targeted for modification and a line pattern provided in a layer lower than this line pattern or the semiconductor substrate. The interconnection capacitance C_bottom mainly varies by the increase or decrease of the width of the line pattern targeted for modification.

Table 2 shows one example of changes in the interconnection capacitances C_coupling, C_top and C_bottom with a change in the width of the line pattern and a change in the line space in a semiconductor device. Table 2 will hereinafter be called an interconnection capacitance table. The interconnection capacitance table is obtained on the basis of an analysis by experiment or by the simulator 3. A plurality of interconnection capacitance tables are created in accordance with semiconductor devices to be manufactured and interconnect layer data.

TABLE 2

| Line pattern | | | | | |
| --- | --- | --- | --- | --- | --- |
| Space [μm] | Width [μm] | C_top [fF/μm] | C_bottom [fF/μm] | C_coupling [fF/μm] | C_total [fF/μm] |
| 0.12 | 0.12 | 0.016 | 0.024 | 0.090 | 0.24 |
| 0.20 | 0.12 | 0.030 | 0.030 | 0.050 | 0.15 |
| 0.40 | 0.12 | 0.040 | 0.040 | 0.020 | 0.10 |
| 0.60 | 0.12 | 0.050 | 0.050 | 0.010 | 0.10 |
| 1.000 | 0.12 | 0.060 | 0.060 | 0.005 | 0.10 |

As in the interconnection capacitance table shown in Table 2, the capacitance is in inverse proportion to the space between two conductors (line patterns), so that the interconnection capacitance C_coupling decreases if the space between the line patterns increases. On the other hand, the interconnection capacitances C_top and C_bottom increase if the space increases. Moreover, as the capacitance is in proportion to the area of the conductor, the interconnection capacitances increase if the width of the line pattern increases. Then, a total value C_total of the interconnection capacitances of a certain line pattern is found from the interconnection capacitances C_coupling, C_top and C_bottom. For example, this interconnection capacitance C_total is referred to as a value of a capacitance variation of the line pattern of the modification guide data.

In addition, the interconnection capacitance C_coupling, C_top, C_bottom, C_total in the interconnection capacitance table is indicated as the capacitance per μm in Table 2, but is not limited thereto. Moreover, the variation of the interconnection capacitance is indicated by, for example, an absolute value in Table 2.

The computer 2 comprises an interconnection capacitance evaluation tool 26, and the modification guide data 25a to 25c are evaluated on the basis of a plurality of interconnection capacitance tables 28 and a plurality of pieces of variation threshold information 27. In addition, the interconnection capacitance evaluation tool 26 is provided by a storage unit (not shown) provided inside or outside the computer or a communication line such as an intranet or the Internet.

The variation threshold information 27 indicates information on an allowable variation of the interconnection capacitance when line pattern data contained in certain interconnect layer pattern data is modified. The allowable variation contained in the variation threshold information is indicated by, for example, a variation of the interconnection capacitance for one modification target point. This allowable variation is defined, for example, in a range which can assure required synchronous timing for a semiconductor device to be manufactured. In addition, in the present example, the allowable variation for the interconnect layer pattern 10 is, for example, 0.0001 fF per part.

The modification guide data 25a to 25c are evaluated by the interconnection capacitance evaluation tool 26 on the basis of the interconnection capacitance tables 28 and the variation threshold information 27.

A variation of the interconnection capacitance of the line pattern data by the modification guide data 25a is calculated to be 0.005 fF (a calculation 29a) with reference to the predetermined interconnection capacitance data 28. This is attributed to the increase of the interconnection capacitance due to a decreased space between the line pattern data L3 and the line pattern data L4.

A variation of the interconnection capacitance of the line pattern data by the modification guide data 25b is calculated to be 0.002 fF (a calculation 29b) with reference to the interconnection capacitance data. In the modification guide data 25b, a part of the line pattern data L3 is closer to the line pattern data L4, so that the variation of the interconnection capacitance is smaller than in the modification guide data 25a in which the whole line pattern L3 is closer to the line pattern L4.

A variation of the interconnection capacitance of the modification guide data 25c is calculated to be 0.001 fF (a calculation 29c) with reference to the interconnection capacitance data. In the modification guide data 25c, the variation is small because a part of the line pattern data L1 is moved in a direction in which the space between this part and the line pattern data L3 adjacent thereto increases.

Then, the variation of the interconnection capacitance of each modification guide data calculated on the basis of the interconnection capacitance table 28 is compared with the variation threshold information 27. As shown in FIG. 6, the interconnect layer pattern data 10 contains one modification target point (process risk point HS). Further, the allowable variation indicated by the variation threshold information 27 is 0.001 per point here.

Therefore, the result 29c for the modification guide data 25c satisfies the allowable value of the variation threshold information 27.

Thus, the modification guide data 25c is adopted as the modification guide for the interconnect layer pattern data 10. Then, the process risk point HS of the interconnect layer pattern data 10 is modified by the computer 2 on the basis of the adopted modification guide data.

As described above, in the third evaluation method, a plurality of modification guide data are evaluated on the basis of the variation of the interconnection capacitance, and one of the modification guides which has a small change in the variation of the interconnection capacitance is selected and adopted.

Hence, according to the third evaluation method, the process risk point can be modified considering the variation of the interconnection capacitance due to a change in the shape of the line pattern data contained in the pattern data to be modified and considering a change in the RC delay of a semiconductor device to be manufactured.

That is, according to the present evaluation method, the process risk point can be modified by a modification guide which can assure a predetermined synchronous clock, such that it is possible to reduce retests for the timing verification after the layout modification, and the layout design produced by the line pattern data can be made more efficient.

Consequently, according to the pattern data generation method of the embodiment of the present invention, the use of the third evaluation method makes it possible to provide a design layout produced by highly reliable line pattern data in a short design TAT. Further, the reliability of the design layout produced by the line pattern data can be improved, so that the production yield of semiconductor devices can be improved.

In addition, although one process risk point HS alone is shown in FIG. 6 for the simplification of explanation, the present evaluation method is also applicable to interconnect layer pattern data (line pattern data) containing two or more process risk points.

(3) Judgment of Modification

In the pattern data generation method of the embodiment of the present invention, the modification guide for the line pattern data is evaluated using the first to third evaluation methods described above as to the modification guide data for the extracted process risk point.

In the pattern data generation method of the embodiment of the present invention, the first to third evaluation methods are used to secure a process margin of an interconnection to be formed and to compensate for the electric characteristics of an interconnection to be formed, thereby modifying a process risk point. However, when the design layout and the design TAT for the mask pattern are considered, the modification of the pattern data at the process risk point may not be preferable in some cases.

An example is described below which can further reduce the design TAT by not modifying a point that is not preferred to be modified. Before the step (ST6) of modifying the process risk point, this example additionally comprises the steps of: determining a judgment guideline or judgment standard for judging whether to modify the line pattern data targeted for modification as a process risk point; and judging whether to modify the process risk point in the pattern data when the judgment guideline or judgment standard is satisfied.

(3.1) First Judgment Scheme

In the pattern data generation method of the embodiment of the present invention, a critical path which decides the operation timing of a semiconductor device and a line pattern located in the vicinity thereof may sometimes be modified by the evaluation results based on the first to third evaluation methods.

However, when the line pattern data for the formation of the critical path and interconnection located in the vicinity thereof are modified, there is a concern that electric characteristics may be changed and thus the timing of an operation clock may be greatly affected.

Therefore, when the critical path and the line pattern located in the vicinity thereof are modified, the timing verification has to be carried out for every modification, which increases the TAT before the completion of the layout of the line pattern.

Thus, in a first judgment scheme, an example is described wherein when the critical path and the line pattern data located in the vicinity thereof are modified, modification conditions as a judgment guideline for a modification considering the change of electric characteristics and a process risk level are set, thus judging whether to modify these line patterns. It is to be noted that the same signs are assigned to the same members as those described above and such members are not described in detail.

The first judgment scheme used in the pattern data generation method of the embodiment of the present invention is described below with reference to FIG. 7, FIG. 8 and Table 3.

Figure 7:
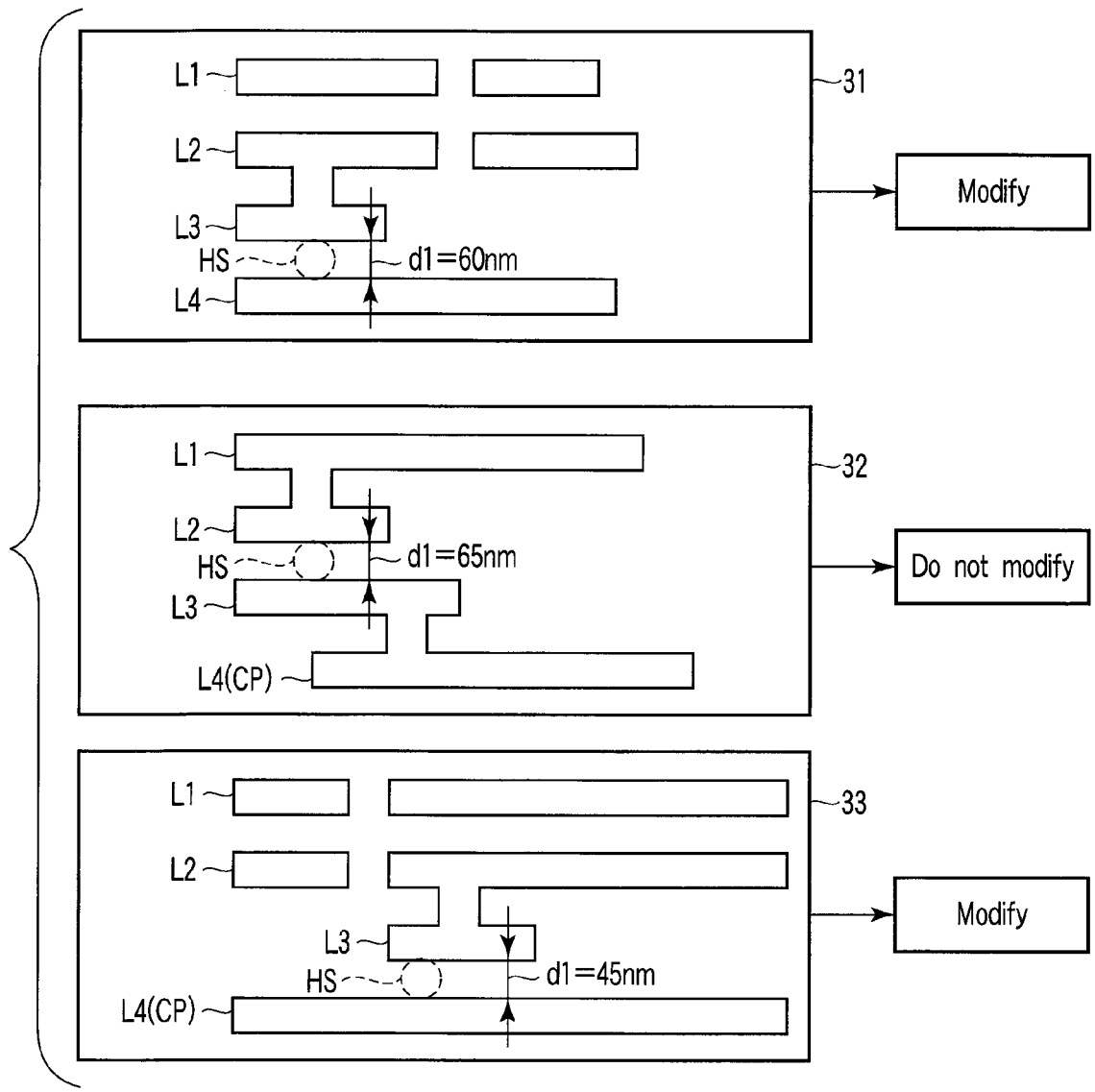
FIG. 7 is a diagram showing examples of a line pattern.

FIG. 7 shows interconnect layer pattern data 31 to 33 containing process risk points HS extracted by the computer 2.

In the interconnect layer pattern data 31, the line pattern data L1 to L4 are interconnection lines which are not critical paths (hereinafter referred to as noncritical path), and the process risk point HS is present between the line pattern data L3 and the line pattern data L4.

In the interconnect layer pattern data 32, among the line pattern data L1 to L4 (CP), the line pattern data L4 (CP) is a critical path, and the line pattern data L3 is a pattern adjacent to the critical path (line pattern data L4 (CP)). In addition, the line pattern adjacent to the critical path is called a critical path adjacent pattern.

Furthermore, in the interconnect layer pattern data 32, the process risk point HS is present between the line pattern data L2 and the line pattern data L3. In addition, whether the line pattern data contained in the interconnect layer pattern data is a critical path is recognized by, for example, matching a critical path extracted by the timing verification with coordinate data for the design layout data input to the computer 2. Alternatively, critical path information may be previously added to the line pattern data in the design layout or in the layer.

Moreover, in the interconnect layer pattern data 33, the line pattern data L4 (CP) is a critical path, and the process risk point HS is present between the line pattern data L4 (CP) and the line pattern data L3.

Whether to modify these interconnect layer pattern data 31 to 33 is judged, for example, on the basis of conditions shown in Table 3. It is to be noted that the modification conditions shown in Table 3 serving as the guideline for the modification judgment are illustrated by way of example only and are not limitations.

TABLE 3

| Modification target | Modification conditions |
| --- | --- |
| Noncritical path | Short: 70 nm or less |
|  | Open: 80 nm or less |
| Adjacent to critical path | Short: 60 nm or less |
|  | Open: 60 nm or less |
| Critical path | Short: 50 nm or less |
|  | Open: 55 nm or less |

As shown in Table 3, in the present judgment scheme, more severe modification conditions are set for the pattern data for forming the critical path and the critical path adjacent pattern than the modification conditions for the pattern data for forming the line pattern of the noncritical path.

That is, such conditions for modification are set in order to restrict the modifications of the critical path and the critical path adjacent pattern so that the electric characteristics of the critical path are not changed due to the modification of the line pattern data. Thus, in the pattern data generation method of the present embodiment, the number of timing verifications is reduced, and a short design TAT is achieved.

Table 3 is more specifically described below with reference to FIG. 8.

Figure 8:
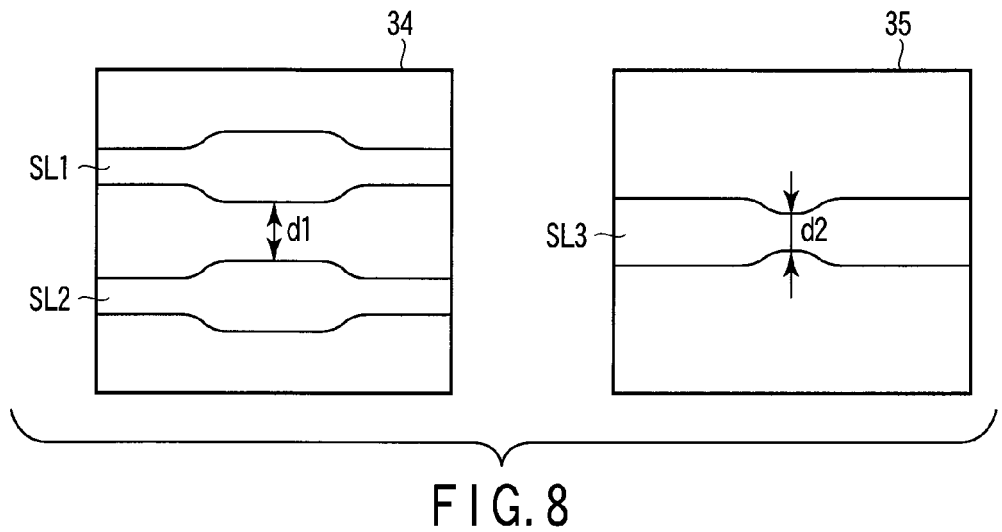
FIG. 8 is a diagram for explaining an example of a judgment of the modification of the line pattern data.

For example, when there is a possibility that a short circuit may be caused between adjacent two line pattern data, whether to modify is judged so that an interconnection distance d1 between two interconnection patterns L1 and L2 is used as a judgment condition for the modification in interconnect layer pattern data 34 as shown in FIG. 8.

When both the two line pattern data L3 and L4 are not critical paths and critical path adjacent patterns as in the interconnect layer pattern data 31 in FIG. 7, the data is modified as a target for the modification of the short circuit if the interconnection distance d1 is 70 nm or less as shown in Table 3. Since the interconnection distance d1 is 60 nm in the interconnect layer pattern data 31, the pattern data is modified for the process risk point HS. As described above, neither the line pattern data L3 nor the line pattern data L4 is a critical path, so that there is no problem with the modification of the data.

When one line pattern data L3 of the two line pattern data is a critical path adjacent pattern as in the interconnect layer pattern data 32 in FIG. 7, the pattern data is modified as a target for the modification of the short circuit if the interconnection distance d1 is 60 nm or less as shown in Table 3. The data is not targeted for modification in the interconnect layer pattern data 32 because the interconnection distance d1 is 65 nm, so that the line pattern data L2 and L3 are not modified. Therefore, the shapes of the critical path and an interconnection pattern located in the vicinity thereof are not changed, so that the electric characteristics of the critical path are not changed. There is thus no need to carry out the timing verification again after the modification of the design layout data.

Furthermore, when one line pattern data L4 (CP) of the two line pattern data is a critical path as in the interconnect layer pattern data 33 in FIG. 7, more severe modification conditions are set than those for other interconnection lines as shown in Table 3, and the data is modified as a target for the modification of the short circuit if the interconnection distance d1 is 50 nm or less. In the interconnect layer pattern data 33, the line pattern data L4 (CP) is a critical path, and there is a possibility that the electric characteristics may change if the data is modified, so that the modification is not preferable. However, the interconnection distance d1 is 45 nm, and it is therefore highly likely that a short circuit is caused. In order to prevent this, the pattern data is modified to secure a process margin of an actual interconnection.

In addition, in the interconnect layer pattern data 33, if the interconnection distance d1 is greater than 50 nm, the data is not modified for the process risk point HS. In that case, the electric characteristics of the critical path are not changed, and there is no need to carry out the timing verification again after the modification of the design layout data.

Likewise, when there is a possibility that the line pattern may open (breakage), whether to modify the pattern data is judged so that a width d2 of the line pattern data SL3 in interconnect layer pattern data 35 is used as a judgment guideline, as shown in Table 3 and FIG. 8. Specifically, as shown in table 3, with regard to the line pattern data for a noncritical path, the line pattern data is modified when the width d2 of the line pattern data is 80 nm or less, and the shape of the line pattern data is changed. With regard to the critical path adjacent pattern, its line pattern data is modified when the width d2 of the line pattern data is 60 nm or less.

On the other hand, with regard to the line pattern data acting as a critical path, data modification is not preferable if the design TAT is considered. Therefore, as in the case where a short circuit is caused in the interconnection, more severe modification conditions are set than the noncritical path and the critical path adjacent pattern, and the line pattern data is modified when the interconnection width d2 is 55 nm or less.

Thus, more severe modification conditions are set for the line pattern data acting as a critical path and for the critical path adjacent pattern data than the modification conditions for other line pattern data. This restricts the modification of data corresponding to the line pattern acting as a critical path.

As described above, in the first judgment scheme, even at about the same process risk level, modification conditions are set in accordance with the characteristics required for interconnection lines, and whether to modify the pattern data is judged.

Thus, in the pattern data generation method of the embodiment of the present invention, the use of the first judgment scheme makes it possible to restrict a modification which deteriorates the TAT, such as the modification of the line pattern data acting as a critical path which leads to an increase in the number of timing verifications.

In addition, the judgment based on the modification conditions in the present judgment scheme can be made for the interconnect layer pattern data extracted as a process risk point or for the generated modification guide data, for example, at any point between the step of extracting the process risk point and the step of selecting a modification guide. Moreover, the modification conditions as the judgment guideline shown in Table 3 are provided as, for example, data by the evaluation database 4A, a storage unit (not shown) provided inside or outside the computer 2, or a communication line, and recognized and judged by the computer 2 and the tools 12, 22.

(3.2) Second Judgment Scheme

In the pattern data generation method of the embodiment of the present invention, a process risk point is modified considering adverse effects on the shapes of other line patterns and on the electric characteristics of an actual interconnection formed on the basis of the line pattern data.

However, in general, for example, a point such as a short circuit between line patterns of the same potential which has a small influence on the electric characteristics and which does not necessarily have to be modified is also extracted as a process risk point.

If the pattern data for such a point is also modified, changes are made not only in the shape of the line pattern at the short circuit point but also in the shapes of the line patterns therearound. As a result, the interconnection quality (e.g., electric characteristics) of the line pattern which does not act as a process risk point is affected, and re-verification of the electric characteristics is required, leading to a deteriorated design TAT.

In a second judgment scheme, an example is described wherein whether to modify the line pattern data is judged considering the necessity for the modification of the process risk point on the basis of a risk posed to the electric characteristics. It is to be noted that the same signs are assigned to the same members as those described above and such members are not described in detail.

Figure 9:
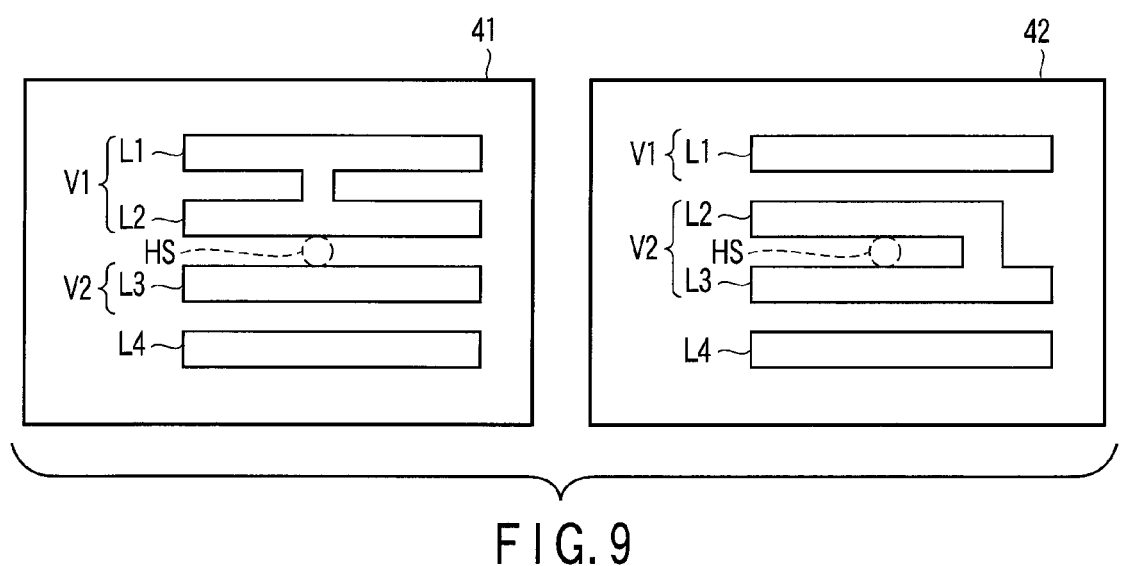
FIG. 9 is a diagram for explaining an example of a judgment of the modification of the line pattern data.

First, a judgment guideline for a modification in a short circuit between interconnection lines is described using Table 4 and FIG. 9.

TABLE 4

| Modification target | Degree of need for modification | Judgment standard |
|---|---|---|
| Short circuit between patterns of different potentials | High | Low |
| Short circuit between patterns of the same potential | Low | High |

Table 4 shows an example in which a judgment guideline for whether to make a modification is set using a potential difference between adjacent two line patterns as an evaluation item. Moreover, FIG. 9 shows an example of a process risk point HS where a short circuit is caused between adjacent line patterns.

In interconnect layer pattern data 41 in FIG. 9, the line pattern data L1 and L2 are lines of the same potential which are supplied with a potential V1. The line pattern data L3 is supplied with a potential V2 different from the potential V1. Moreover, the process risk point HS is present between the line pattern data L2 and the line pattern data L3 that are different in potential.

If a short circuit is caused between two line patterns of different potentials, a malfunction occurs in a semiconductor device to be manufactured, and the production yield of semiconductor devices decreases. The degree of the need for modification is therefore high in the line pattern data at the process risk point where a short circuit between interconnection lines of different potentials is caused, and as shown in Table 4, the data is modified even if the shapes and electric characteristics of other line patterns are greatly affected. Thus, a low judgment standard for modification is set so that the data modification is easily carried out by the computer 2.

On the other hand, in interconnect layer pattern data 42 in FIG. 9, the line pattern data L1 is supplied with the potential V1. The line pattern data L2 and L3 are supplied with the potential V2, and the two pattern data are lines of the same potential. Moreover, the process risk point HS is present between the line pattern data L2 and the line pattern data L3 that are of the same potential.

In this case, even if a short circuit is caused between the two line patterns of the same potential, the operation of a semiconductor device to be manufactured is not much affected. On the other hand, if these line pattern data are modified, the shape, arrangement and electric characteristics of other line patterns are changed, resulting in a deteriorated TAT for the generation of the pattern data. Therefore, as shown in Table 4, the degree of the need for modification is low in the line pattern data at the process risk point where a short circuit between interconnect layers of the same potential is caused, so that a high standard value for the modification judgment is set to restrict the modification. To this end, a high judgment standard for modification is set so that the line pattern is not easily modified.

As described above, as shown in Table 4 and FIG. 9, whether to make a modification between adjacent two line pattern data is judged on the basis of the potential difference therebetween, and a low judgment standard is set for a process risk point at a high degree of the need for modification such as a modification between line patterns of different potentials, so that the data is easily modified. Moreover, at a process risk point where the operation of a semiconductor device to be manufactured is compensated for without modification, for example, between line patterns of the same potential, the pattern shape and the electric characteristics are changed, and therefore, a high judgment standard is set for such a process risk point so that the data is not easily modified.

Figure 10:
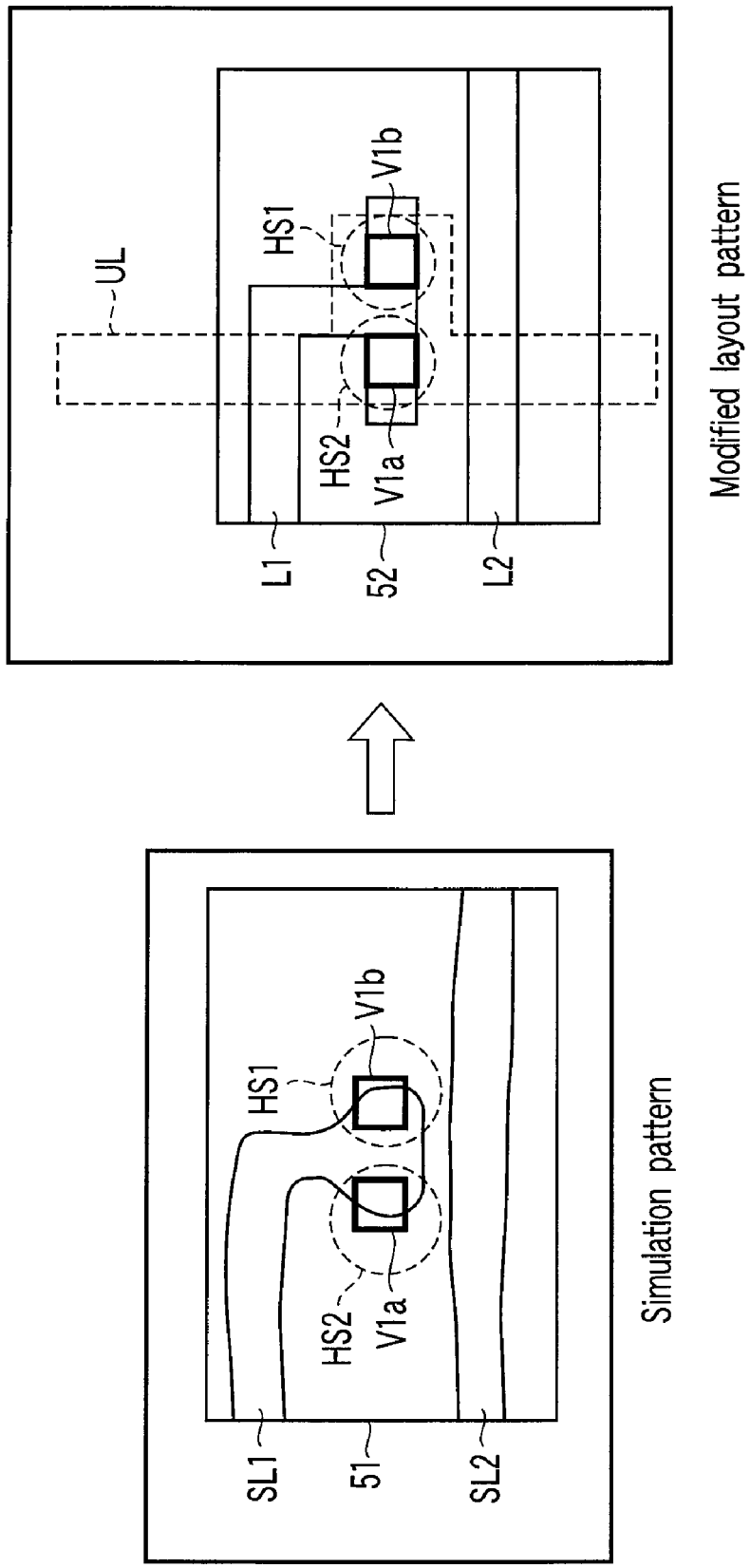
FIG. 10 is a diagram for explaining an example of a judgment of the modification of the line pattern data.
Figure 11:
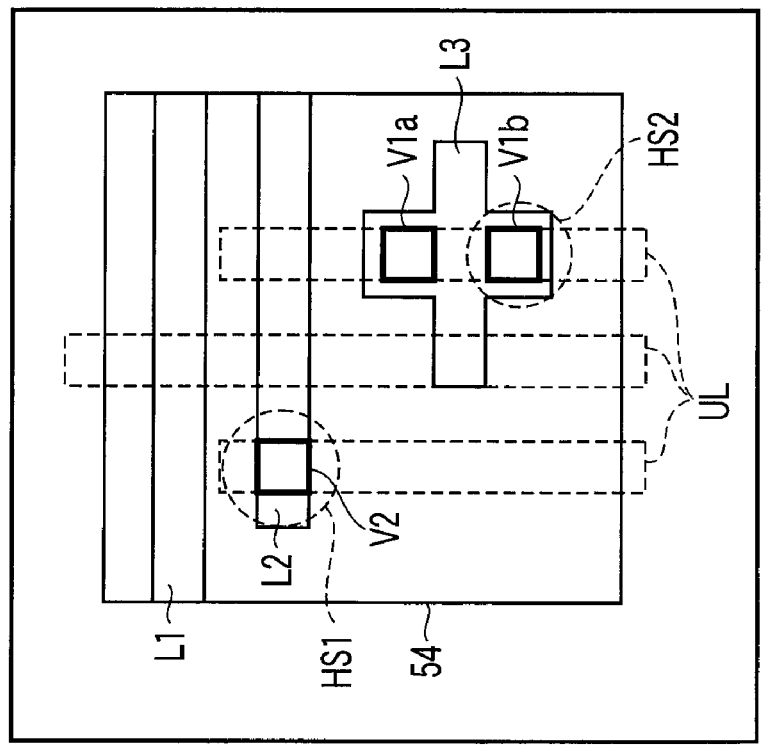
FIG. 11 is a diagram for explaining an example of a judgment of the modification of the line pattern data.
Figure 11:
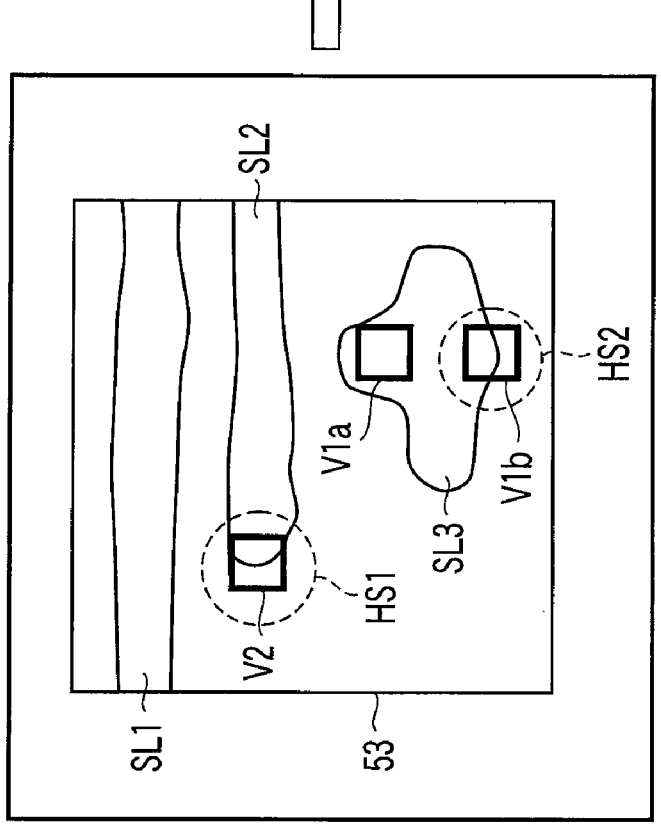

Next, an example is described using Table 5, FIG. 10 and FIG. 11 wherein whether to modify a process risk point is judged considering the degree of the need for modification on the basis of the risk of a via and a contact posed to the characteristics of the line pattern.

TABLE 5

| Modification target | Degree of need for modification | Judgment standard |
|---|---|---|
| Coverage error of single via | High | Low |
| Coverage errors of two of double via | High | Low |
| Coverage error of only one of double via | Low | High |

Table 5 shows an example in which whether to modify pattern data is judged using coverage errors of the vias as judgment items on the basis of the number of vias provided in one contact area and the number of coverage errors, in the case of process risk points HS1, HS2. In addition, the contact area means an area where a via or contact is provided in a line pattern.

Furthermore, FIG. 10 and FIG. 11 show simulation pattern data and interconnect layer pattern data for a via which connects a line pattern to an upper line pattern. In addition, in FIG. 10 and FIG. 11, a line pattern UL of an interconnect layer (referred to as a second interconnect layer) located higher than an interconnect layer (referred to as a first interconnect layer) where line pattern data SL1 and SL2, L1 to L3 are provided is indicated by a broken line.

FIG. 10 shows a line pattern data in which two vias V1a and V1b are provided in one contact area. A structure in which two vias are provided in one contact area will hereinafter be called a double via structure.

In the simulation pattern data 51, the patterns of the two vias V1a and V1b extend beyond the pattern of the simulation line pattern data SL1, and the line pattern data SL1 has insufficient coverage of the vias V1a and V1b.

In this case, coverage errors (process risk points) HS1, HS2 are caused in both of the two vias, which can greatly affect the operation characteristics of a semiconductor device.

Therefore, as shown in Table 5, the degree of the need for data modification is high, and a low judgment standard is thus set so that these coverage errors are easily modified by the computer 2.

Consequently, as shown in a modified layout pattern 52 in FIG. 10, the shape of the line pattern L1 or the shape of the line pattern UL provided in an upper layer is changed to modify the pattern data so that the coverage errors of the vias V1a and V1b may not be caused.

Furthermore, in simulation data 53 shown in FIG. 11, an example is shown wherein there are provided simulation line patterns SL1 to SL3, one via V2 in one contact area, and two vias V1a and V1b in one contact area. A structure in which one via is provided in one contact area will hereinafter be called a single via structure.

In the example shown in FIG. 11, a coverage error HS1 is caused between the simulation line pattern SL2 and the via V2.

In the case of the single via structure, a malfunction occurs in a semiconductor device to be manufactured if one via does not electrically function. Therefore, as shown in Table 5, the degree of the need for data modification is high, and a low judgment standard is thus set so that the coverage error HS1 of the single via structure is easily modified by the computer 2.

On the other hand, in the double via structure shown in FIG. 11, the coverage error HS2 is caused in the simulation line pattern SL3 and one via V1b of the two vias V1a and V1b. In the case of the double via structure, even if one via does not electrically function due to insufficient coverage, the operation of the semiconductor device can be compensated for as long as the other via is electrically functioning. Therefore, the influence of one coverage error in the double via structure on the operation of the semiconductor device is small.

Thus, as shown in Table 5, a high judgment standard for modification is set for one coverage error in the double via structure so that the coverage error is not easily modified, because the degree of the need for data modification is low when the influence of the modification on other line pattern data and the design TAT are considered.

Consequently, as shown in a modified layout pattern 54 in FIG. 11, the shape of the line pattern data L2 or the shape of the line pattern UL provided in an upper layer is changed to modify the pattern data so that the coverage error of the via V2 may not be caused. On the other hand, for one via V1b of the double via structure, the modification of pattern data for removing the coverage error is not carried out.

Thus, a judgment standard for the modification of pattern data containing a process risk point is set on the basis of the number of vias and contacts in one contact area and the number of coverage errors, and a low judgment standard is set for a point which needs to be modified to compensate for the operation of the semiconductor device. On the other hand, for a point where the operation of a semiconductor device to be manufactured is compensated for without data modification, a high judgment standard is set so that the modification of pattern data which changes the pattern shape and the electric characteristics is not carried out.

Consequently, according to the pattern data generation method of the embodiment of the present invention, the use of the second judgment scheme makes it possible to provide a design layout produced by highly reliable line pattern data in a short design TAT.

In addition, the modification judgment in the present embodiment can be made for the interconnect layer pattern data extracted as a process risk point or for the generated modification guide data, for example, at any point between the step of extracting the process risk point and the step of selecting a modification guide. Moreover, the judgment standards shown in Tables 4 and 5 are provided as, for example, data by the evaluation database 4A, a storage unit (not shown) provided inside or outside the computer 2, or a communication line, and recognized and judged by the computer 2 and the tools 12, 22.

(4) Applications
(4.1) First Application

In development stages of a semiconductor device manufacturing process, with the progress of stages including a process development initial stage, a development advancement stage and a process development completion stage, items regarded as important in the process development change at the respective stages, such as the production yield, signal integrity (signal quality) and chip area.

In the applications of the embodiment of the present invention, examples are described in which a modification guide is selected with different evaluation items at each stage of the process development.

As shown in FIG. 12, for example, development initial stage setting data 61, development middle stage setting data 62 and development completion stage setting data 63 are set in the computer 2 as the development stages of the semiconductor device.

Then, out of these stages 61 to 63, a plurality of evaluation items which have been described in the first to third evaluation methods and in the first and second judgment schemes and which correspond to request items set in an evaluation request item generation tool 64 are selected, and evaluation item sets 65 to 67 containing these evaluation items are created. Then, on the basis of the evaluation item sets 65 to 67, the modification guide for the line pattern data corresponding to the extracted process risk point is evaluated.

For example, when the development initial stage setting data 61 is selected by the computer 2 shown in FIG. 2, a plurality of evaluation items which can, for example, stabilize a manufacturing process and improve the production yield are set as, for example, the evaluation item set 65 because the stability of the manufacturing process and the improvement of the production yield are desired at the development initial stage. This is due to the fact that the manufacturing process is not stable at the process development initial stage and a rapid improvement of the production yield is therefore regarded as important. Thus, in the evaluation of the pattern modification guide data, the evaluation items are tuned by, for example, the evaluation request item generation tool 64 so that even the modification guide data with a high penalty is selected and adopted by resetting a low penalty for such modification guide data; for example, the modification guide data that causes a major change in the layout as shown in Table 1 in the first evaluation method, the movement of other line patterns, or an increase in the chip area. Thus, the evaluation item set 65 is set. Moreover, even for a process risk point (pattern data) at a low degree of the need for modification, such as coverage errors in the double via described in the second judgment scheme, the judgment standards are tuned by the evaluation request item generation tool 64 and set in the evaluation item set 65 so that the need for modification increases to improve the production yield.

When the development middle stage setting data 62 is selected by the computer 2, for example, a plurality of items which can reduce the cost of a semiconductor device to be manufactured are tuned by an evaluation request item generation tool 64 in the process development advancement stage. Then, the plurality of tuned items are set as an evaluation item set 66. In this case, the evaluation items are tuned by the evaluation request item generation tool 64 to set the evaluation item set 66 so that the modification guide data which does not increase the chip area of the semiconductor device because of, for example, less movement of the line pattern data or the modification guide data which can reduce the chip area may be selected and adopted.

On the other hand, at the process development completion stage, a plurality of evaluation items which can stabilize the interconnection quality are tuned and set as the evaluation item set 67.

That is, in the process development completion stage, the operation characteristics of a semiconductor device to be manufactured are desired to be stable, so that the stabilization of the interconnection quality is regarded as important. Thus, in the evaluation of the pattern modification guide data, the evaluation item set 67 is tuned to attach importance to the evaluation item of the electric characteristics shown in Table 2 in the second evaluation method and to the item which restricts the modification of the line pattern data acting as a critical path described in the first judgment scheme.

Then, on the basis of the evaluation item set tuned in accordance with the development stage of the semiconductor device, the modification guide data is evaluated and the interconnection pattern data is modified.

In addition, in accordance with the process development stage, the computer 2 can also select at least one evaluation item corresponding to the item required by the evaluation request item generation tool 64 and further change the setting of the evaluation items to automatically generate the evaluation item sets 65 to 67.

As described above, in the present application, the evaluation item set comprising the evaluation items and modification judgment items is created so that the modification guide data regarded as important and required by each stage may be adopted for each process development stage of a semiconductor device. Accordingly, the modification guide data is evaluated and the line pattern data is modified.

Consequently, according to the present application, at the stage of developing a semiconductor device and its manufacturing process, it is possible to create a design layout produced by the pattern data corresponding to the requirement in the development stage in a short design TAT, and a design layout produced by highly reliable pattern data can be provided.

(4.2) Second Application

A second application of the embodiment of the present invention is described below with FIG. 13. It is to be noted that the same steps as those in the pattern data generation method shown in FIG. 1 are not described.

Figure 13:
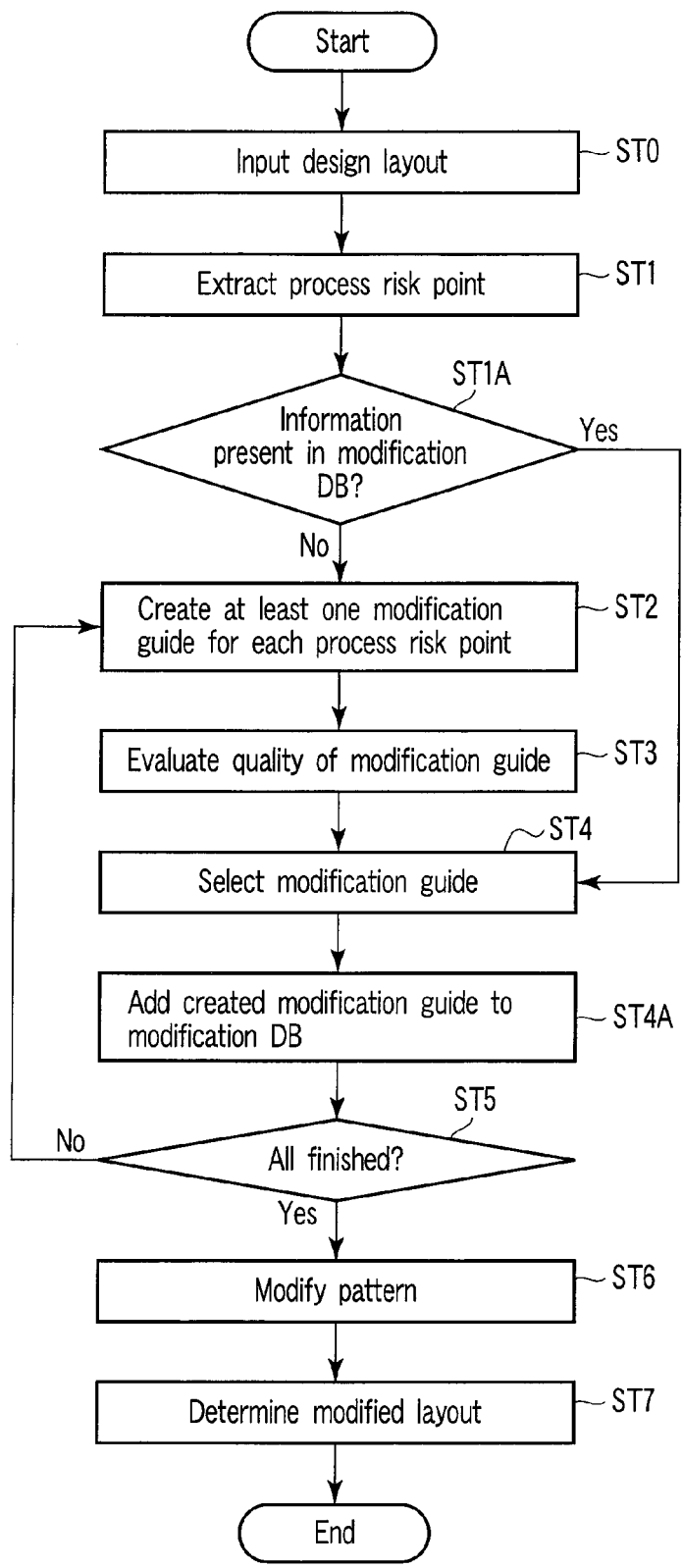
FIG. 13 is a diagram for explaining an application of the embodiment of the present invention.

As shown in FIG. 13, after interconnect layer pattern data containing a process risk point is extracted (ST1), a search is ran to see whether there is modification guide data corresponding to the extracted interconnect layer pattern data in the modification guide database 5A in FIG. 2, on the basis of the layout (hereinafter referred to as line pattern information) of the line pattern data located in the vicinity of the process risk point in the extracted interconnect layer pattern data (ST1A). The modification guide database 5A stores a plurality of pieces of line pattern information.

When the modification guide database 5A contains no modification guide data corresponding to the line pattern information for the extracted process risk point (interconnect layer pattern data), at least one modification guide for the extracted process risk point (interconnect layer pattern data) is generated as in the pattern data generation method in FIG. 1 (ST2). Then, the generated guide data is evaluated on the basis of the first to third evaluation methods and the first and second judgment schemes (ST3), and one modification guide data is selected (ST4). In the pattern data generation method of the present application, when the modification guide database 5A does not have the line pattern information for the process risk point to be modified, the interconnect layer pattern data containing the process risk point or the line pattern data located in the vicinity of the process risk point is stored as the line pattern information in the modification guide database 5A. Moreover, the selected modification guide data is stored in the modification guide database 5A as a modification guide corresponding to the line pattern information to be modified.

On the other hand, when the modification guide database 5A has the modification guide data corresponding to the line pattern information for the extracted process risk point (interconnect layer pattern data), the modification guide data present in the modification guide database 5A is selected as a modification guide for the extracted process risk point. That is, in this case, the generation of the modification guide (ST2) and the evaluation of the modification proposal (ST3) are not carried out. The reason is that the modification guide data read from the modification guide database 5A on the basis of the line pattern information is data which has been evaluated as a modification guide for the line pattern indicated by the line pattern information and adopted as a modification guide before.

After the steps described above, a pattern data is replaced with the interconnect layer pattern data containing the extracted process risk point when the pattern data is modified (ST6).

Thus, the pattern data generation method shown in FIG. 13 uses the history of previous modifications of the pattern data to modify the interconnect layer pattern data containing the extracted process risk point and the line pattern data. Therefore, the pattern data generation method shown in FIG. 13 can dispense with the step of generating the modification guide data and the step of evaluating the generated modification guide data.

Consequently, according to the second application, it is possible to reduce the design turnaround time.

4. Comparative Example

A comparative example of other examples and the embodiment of the present invention described below.

For example, in the above-mentioned techniques disclosed in Jpn. Pat. Appln. KOKAI Publication No. 2005-181524 and Jpn. Pat. Appln. KOKAI Publication No. 2005-181612, the shape of line pattern data is changed to modify pattern data in order to achieve the OPC processing for a process risk point produced by, for example, an optical proximity effect. However, this modification is intended to secure a process margin, and this method is not a pattern data generation method that considers the variations of the shape and arrangement of the line pattern data in the pattern data to be modified and the line pattern data located in the vicinity thereof and further considering the variation of the electric characteristics of each interconnection line formed on the basis of the pattern data.

On the other hand, in the embodiment of the present invention, as shown in the first to third evaluation methods, the process risk point is modified so that modification guide data with a small influence is selected and the design layout data is modified after the modification guide data has been evaluated considering the influence on the shape and arrangement of the line pattern data and on the electric characteristics of actual interconnection formed on the basis of line pattern data.

Furthermore, as in the first and second judgment schemes, the modification judgment guideline and judgment condition are set for the pattern data containing the process risk point to secure a process margin for the process risk point, and for points which are not preferred to be modified or points with a low degree of need for modification, whether to modify the interconnect layer pattern is judged so that the electric characteristics of the interconnect layer pattern are not affected.

Thus, for each of a plurality of points to be modified in the design layout, consideration is given to the influence of the shape of the line pattern to be modified on the adjacent pattern, and to a change in the electric characteristics of an interconnection formed on the basis of the modified line pattern data, such that a modification which assures the reliability of the interconnect layer pattern data can be made for each of the process risk points.

Moreover, when the line pattern data is modified, the interconnect layer pattern is previously modified in consideration of the electric characteristics, such that it is possible to reduce retests of the electric characteristics such as the timing verification after the modification of the pattern data, and the layout design produced by the line pattern data can be made more efficient.

Consequently, according to the pattern data generation method of the embodiment of the present invention, the pattern data for the interconnect layer can be generated in a short TAT, and it is possible to provide a design layout produced by highly reliable line pattern data. Further, the reliability of the layout produced by the line pattern data can be improved, so that the production yield of semiconductor devices can be improved.

5. Practical Example

The pattern data generation method described in the embodiment of the present invention can be used in a pattern data generation program.

The pattern data generation method described in the embodiment of the present invention can also be used in a method of manufacturing a mask produced in accordance with pattern data, and in a method of manufacturing a semiconductor device produced in accordance with the produced mask.

A practical example of the embodiment of the present invention is described below with FIG. 14 to FIG. 17.

(1) Program

Figure 14:
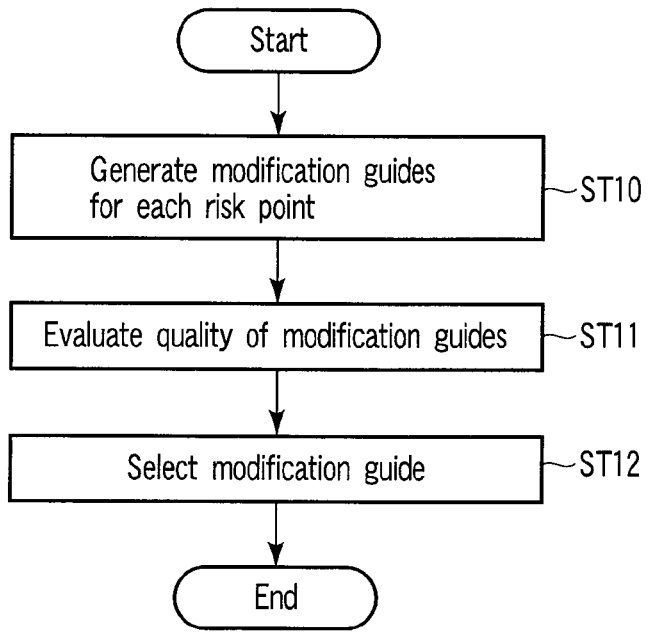
FIG. 14 is a flowchart showing arithmetic processing based on a program.
Figure 15:
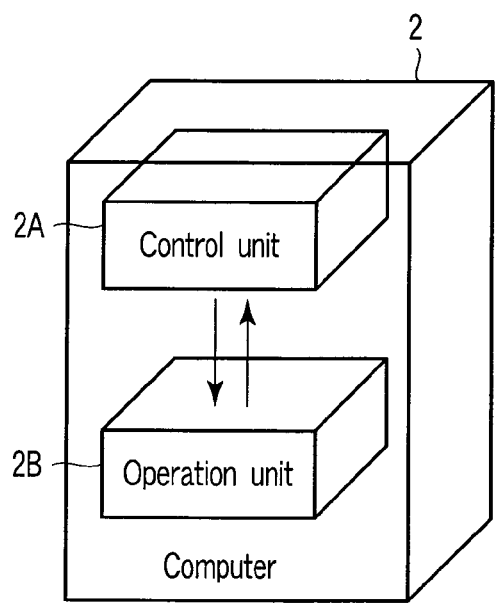
FIG. 15 is a block diagram showing a device to which the program shown in FIG. 14 is applied.

An example in which the embodiment of the present invention is practically used in a program (software) is described with FIG. 14 and FIG. 15.

The pattern data generation method described in the embodiment of the present invention is practically used in, for example, a program (software) for generating pattern data for a semiconductor device as shown in FIG. 14.

This program is stored in, for example, a control unit 2A within the computer 2 shown in FIG. 15. It is to be noted that the program (software) may be provided by being stored in the storage unit (not shown) separately provided inside or outside the computer 2. It may also be provided via a communication line such as the Internet.

The control unit 2A causes an operation unit 2B to execute steps ST10 to ST11 in the flowchart shown in FIG. 14 on the basis of the stored program.

First, process risk points in interconnect layer pattern data are extracted by the control unit 2A from design layout input to the computer 2.

Further, the control unit 2A causes the operation unit 2B to generate at least one modification guide data for each of the process risk points (ST10).

Then, the control unit 2A causes the operation unit 2B to judge whether to modify the pattern data and evaluate the modification guide data, on the basis of the first to third evaluation methods and the first and second judgment schemes shown in the embodiment (ST11).

Subsequently, the control unit 2A causes the operation unit 2B to select the modification guide data on the basis of the evaluation and judgment of the modification guide data (ST12).

Then, the control unit 2A acquires the modification guide data, and the pattern data is modified.

As described above, the pattern data generation method described in the embodiment of the present invention can be practically used in a program for generating pattern data for semiconductor devices.

Consequently, according to the program in which the pattern data generation method of the embodiment of the present invention is practically used, the pattern data can be generated in a short TAT, and it is possible to provide a design layout produced by highly reliable line pattern data, as in the embodiment of the present invention. Further, the reliability of the design layout produced by the line pattern data can be improved, so that the production yield of semiconductor devices can be improved.

(2) Mask Manufacturing Method

Figure 16:
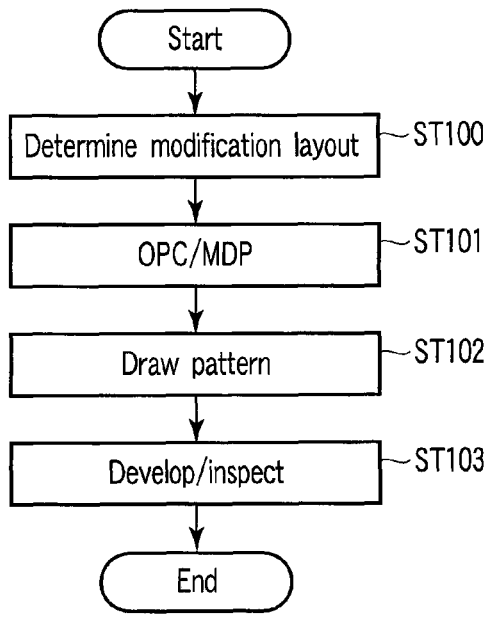
FIG. 16 is a flowchart showing a method of manufacturing a photomask.

A mask manufacturing method in which the pattern data generation method of the embodiment of the present invention is practically used is described below with FIG. 16.

First, a design layout is modified on the basis of the pattern data generation method of the embodiment of the present invention, and a modified layout is determined (ST100). Then, the modified layout data is subjected to the OPC processing and MDP processing, and final mask pattern data is generated (ST101).

Then, a mask pattern is drawn on a mask blanks substrate by, for example, electron beam exposure on the basis of the final mask pattern data (ST102).

Then, after the development of the mask pattern, the pattern developed on the substrate is inspected (ST103). Thus, a photomask is manufactured.

As described above, the design layout is modified to produce a mask pattern according to the pattern data generation method of the embodiment of the present invention, such that it is possible to reduce the TAT for manufacturing a photomask and also to manufacture a highly reliable photomask.

(3) Device Manufacturing Method

Figure 17:
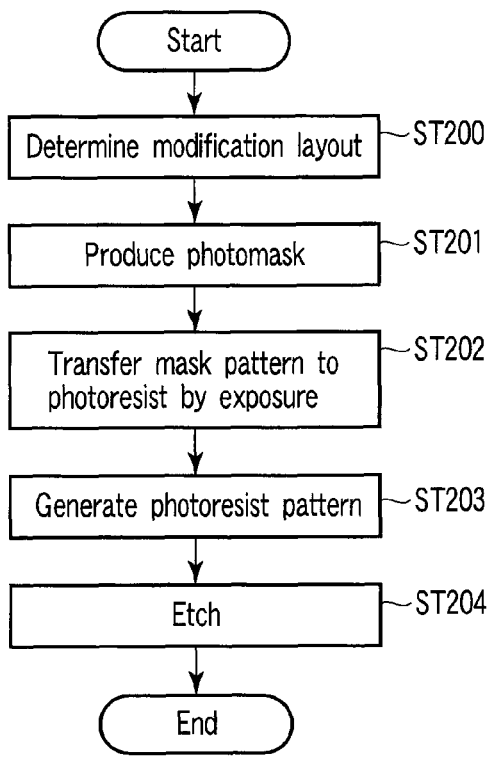
FIG. 17 is a flowchart showing a method of manufacturing a semiconductor device.

A semiconductor device manufacturing method in which the pattern data generation method of the embodiment of the present invention is practically used is described below with FIG. 17.

First, a design layout is modified on the basis of the pattern data generation method of the embodiment of the present invention, and a modified layout data is determined (ST200).

Then, the modified layout data is subjected to the OPC processing and MDP processing to generate final mask pattern data, and on the basis of this data, a photomask is produced (ST201).

Then, a mask pattern of the photomask is transferred by exposure to a photoresist on a semiconductor substrate (ST202). Further, after the exposure transfer of the mask pattern, the pattern is developed, and a photoresist pattern is formed (ST203).

Using the resist pattern as a mask, a conductive film, an insulating film, etc. on the semiconductor substrate are etched, and a predetermined pattern is formed on the semiconductor substrate (ST204), such that a semiconductor device is manufactured.

As described above, a design layout is created according to the pattern data generation method of the embodiment of the present invention, and a photomask and a semiconductor device are manufactured on the basis of the design layout, such that it is possible to manufacture a highly reliable semiconductor device and improve the production yield of semiconductor devices.

5. Other

The critical path is taken as an example and whether to modify the corresponding pattern data is evaluated and judged in the example of the first judgment scheme described in the embodiment of the present invention, but the present invention is not necessarily applied exclusively to the line pattern data of the critical path. The present invention may be applied to line pattern data which greatly affects the characteristics of a semiconductor device to be manufactured, such as a main power wire or data line in a design layout of line patterns in the semiconductor device.

The first to third evaluation methods and the first and second judgment schemes shown in the embodiment of the present invention are not exclusively carried out separately, and may be suitably carried out in combination.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern data generation method comprising:
   using a computer for:
   creating at least one modification guide to modify a modification target point contained in pattern data for a formation of at least one interconnect layer of a semiconductor device on a wafer;
   evaluating the modification guides on the basis of an evaluation item, the evaluation item being a change in electric characteristics of the interconnect layer of the semiconductor device formed in accordance with the pattern data;
   selecting a predetermined modification guide from among the modification guides on the basis of the evaluation result of the modification guides;
   determining a guideline to judge whether to modify the modification target point contained in the pattern data before modifying the modification target point; and
   modifying the modification target point in accordance with the selected modification guide when the guideline is satisfied,
   wherein when the pattern data containing the modification target point is design pattern data for a critical path or a pattern adjacent to the critical path, the judgment guideline is set to be more severe than when the pattern data containing the modification target point is not the design pattern data for the critical path or the pattern adjacent to the critical path.

2. The pattern data generation method according to claim 1, further comprising:
   judging whether to modify the modification target point on the basis of the difference of potentials supplied to adjacent patterns before modifying the modification target point when the pattern data containing the modification target point is design pattern data for the adjacent patterns.

3. The pattern data generation method according to claim 1, further comprising:
   judging whether to modify the modification target point on the basis of the number of contacts connected to a line pattern or the number of vias before modifying the modification target point when the pattern data containing the modification target point is design pattern data for the line pattern.

4. The pattern data generation method according to claim 1, wherein
   the evaluation item to evaluate the modification guide is changed in accordance with a development stage of a semiconductor device to be manufactured by the pattern data, and the modification guide is evaluated accordingly.

5. The pattern data generation method according to claim 1, further comprising:
   storing the selected modification guide in a database.

6. The pattern data generation method according to claim 5, further comprising:
   retrieving a modification guide to modify the modification target point contained in the pattern data from among the modification guides stored in the database on the basis of a layout of the pattern data, and reading one modification guide corresponding to the layout of the pattern data; and
   using the read modification guide to modify the modification target point contained in the pattern data.

7. The pattern data generation method according to claim 1, further comprising:
   performing OPC processing on the pattern data in which the modification target point has been modified on the basis of the modification guide, thereby generating mask pattern data.

8. The pattern data generation method according to claim 1, wherein
   the change in the electric characteristics to serve as the evaluation item is at least one of a change in RC delay, a change in interconnection length, a change in crosstalk noise, a change in signal change noise, a change in signal reflection noise, a change in power wire IR drop, a change in electromigration, a change in EMI, a change in CA value, and a change in interconnection capacitance.

9. A program stored on a non-transitory computer readable storage medium for causing a computer to execute a pattern data generation method, the method comprising:
   creating at least one modification guide to modify a modification target point contained in pattern data for a formation of at least one interconnect layer of a semiconductor device on a wafer;
   evaluating the modification guides on the basis of an evaluation item, the evaluation item being a change in electric characteristics of the interconnect layer of the semiconductor device formed in accordance with the pattern data;
   selecting a predetermined modification guide from among the modification guides on the basis of the evaluation result of the modification guides;
   determining a guideline to judge whether to modify the modification target point contained in the pattern data before modifying the modification target point; and
   modifying the modification target point in accordance with the selected modification guide when the guideline is satisfied,
   wherein when the pattern data containing the modification target point is design pattern data for a critical path or a pattern adjacent to the critical path, the judgment guideline is set to be more severe than when the pattern data containing the modification target point is not the design pattern data for the critical path or the pattern adjacent to the critical path.

10. The program for causing the computer to execute the pattern data generation method according to claim 9, the method further comprising:
    judging whether to modify the modification target point on the basis of the difference of potentials supplied to adjacent two patterns before modifying the modification target point, when the pattern data containing the modification target point is design pattern data for the adjacent two patterns.

11. The program for causing the computer to execute the pattern data generation method according to claim 9, the method further comprising:

judging whether to modify the modification target point on the basis of the number of contacts connected to a line pattern or the number of vias before modifying the modification target point, when the pattern data containing the modification target point is design pattern data for the line pattern.

12. The program for causing the computer to execute the pattern data generation method according to claim 9, wherein the evaluation item to evaluate the modification guide is changed in accordance with a development stage of a semiconductor device to be manufactured by the pattern data, and the modification guide is evaluated accordingly.

13. The program for causing the computer to execute the pattern data generation method according to claim 9, the method further comprising:

storing the selected modification guide in a storage.

14. The program for causing the computer to execute the pattern data generation method according to claim 13, the method further comprising:

retrieving a modification guide to modify the modification target point contained in the pattern data from among the modification guides stored in the storage on the basis of a layout of the pattern data, and reading one modification guide corresponding to the layout of the pattern data; and using the read modification guide to modify the modification target point contained in the pattern data.

15. The program for causing the computer to execute the pattern data generation method according to claim 9, the method further comprising:

performing OPC processing on the pattern data in which the modification target point has been modified on the basis of the modification guide, thereby generating mask pattern data.

16. The program for causing the computer to execute the pattern data generation method according to claim 9, wherein the change in the electric characteristics to serve as the evaluation item is at least one of a change in RC delay, a change in interconnection length, a change in crosstalk noise, a change in signal change noise, a change in signal reflection noise, a change in power wire IR drop, a change in electromigration, a change in EMI, a change in CA value, and a change in interconnection capacitance.

* * * * *